United States Patent
Ka et al.

(10) Patent No.: US 11,895,903 B2
(45) Date of Patent: Feb. 6, 2024

(54) METHOD OF FORMING PEROVSKITE THIN FILM AND LIGHT-EMITTING DEVICE INCLUDING LAYER MANUFACTURED THEREBY

(71) Applicant: Samsung Display Co., Ltd., Yongin-si (KR)

(72) Inventors: Yoonseok Ka, Yongin-si (KR); Dongchan Kim, Yongin-si (KR); Jiyoung Moon, Yongin-si (KR); Heechang Yoon, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 204 days.

(21) Appl. No.: 17/506,448

(22) Filed: Oct. 20, 2021

(65) Prior Publication Data

US 2022/0344591 A1     Oct. 27, 2022

(30) Foreign Application Priority Data

Apr. 8, 2021  (KR) .................. 10-2021-0046090

(51) Int. Cl.

| | | |
|---|---|---|
| *H01L 23/00* | (2006.01) | |
| *H10K 71/15* | (2023.01) | |
| *C09K 11/61* | (2006.01) | |
| *H10K 50/15* | (2023.01) | |
| *H10K 50/16* | (2023.01) | |
| *H10K 50/17* | (2023.01) | |
| *H10K 71/00* | (2023.01) | |

(52) U.S. Cl.
CPC ............ *H10K 71/15* (2023.02); *C09K 11/616* (2013.01); *H10K 50/15* (2023.02); *H10K 50/16* (2023.02); *H10K 50/17* (2023.02); *H10K 71/00* (2023.02)

(58) Field of Classification Search
CPC ....... H10K 71/15; H10K 71/00; C09K 11/616
See application file for complete search history.

(56) References Cited

U.S. PATENT DOCUMENTS

| | | | |
|---|---|---|---|
| 6,063,138 | A  | 5/2000 | Hanna et al. |
| 9,978,974 | B2 | 5/2018 | Kim et al. |
| 10,784,449 | B2 | 9/2020 | Kim et al. |
| 2020/0220094 | A1 | 7/2020 | Matsushima et al. |

FOREIGN PATENT DOCUMENTS

| | | |
|---|---|---|
| JP | 3386470 | 3/2003 |
| KR | 10-2017-0116630 | 10/2017 |
| KR | 10-2018-0018910 | 2/2018 |
| KR | 10-1839077 | 3/2018 |
| KR | 10-1908708 | 10/2018 |
| KR | 10-2019-0141469 | 12/2019 |
| KR | 10-2020-0044818 | 4/2020 |
| KR | 10-2153569 | 9/2020 |

OTHER PUBLICATIONS

Jun et al., Lead-Free Highly Efficient Blue-Emitting Cs3Cu2I5 with 0D Electronic Structure, Advanced Materials, 2018.

(Continued)

*Primary Examiner* — Anthony Ho
(74) *Attorney, Agent, or Firm* — H.C. Park & Associates, PLC

(57) ABSTRACT

A method of forming a perovskite thin film and a light-emitting device including a layer manufactured by the method.

18 Claims, 3 Drawing Sheets

(56) References Cited

OTHER PUBLICATIONS

Hu, et al., Vacuum-evaporated all-inorganic cesium lead bromine perovskites for high-performance light-emitting diodes, Journal of Materials Chemistry C, 2017.

Zhang, et al., Strongly Emissive Lead-Free 0D Cs3Cu2I5 Perovskites Synthesized by a Room Temperature Solvent Evaporation Crystallization for Down-Conversion Light-Emitting Devices and Fluorescent Inks, Advanced Optical Materials, 2020.

Hameed, et al., Co-axial electrospray: a versatile tool to fabricate hybrid electron transporting materials for high efficiency and stable perovskite photovoltaics, Nanoscale Advances, Royal Society of Chemistry, 2019.

FIG. 3
COMPARATIVE EXAMPLE 1
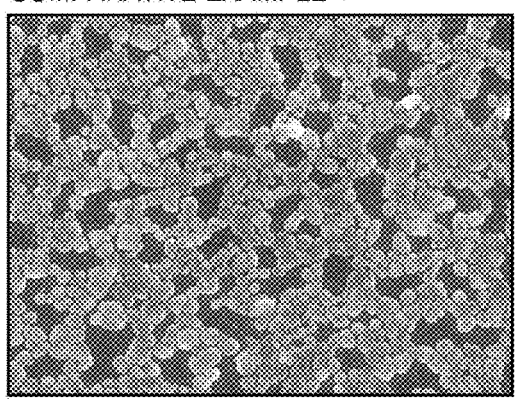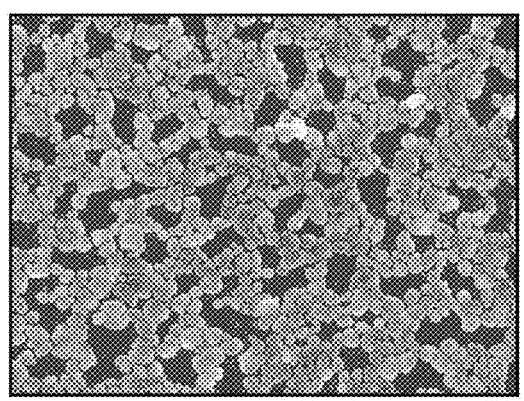
COVERAGE: 71.2%
EXAMPLE 1
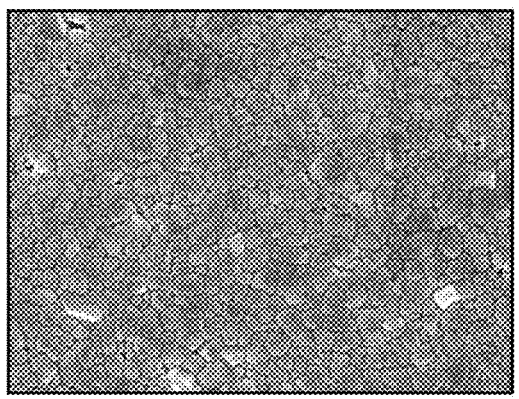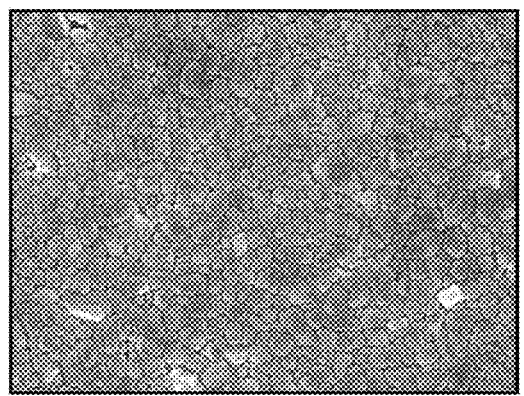
COVERAGE: 98.6%

METHOD OF FORMING PEROVSKITE THIN FILM AND LIGHT-EMITTING DEVICE INCLUDING LAYER MANUFACTURED THEREBY

CROSS-REFERENCE TO RELATED APPLICATION

This application claims priority from and the benefit of Korean Patent Application No. 10-2021-0046090, filed on Apr. 8, 2021, which is hereby incorporated by reference for all purposes as if fully set forth herein.

BACKGROUND

Field

Embodiments of the invention relate generally to a method of forming a perovskite thin film and a light-emitting device including a layer manufactured thereby.

Discussion of the Background

Thin films are known to be formed by methods such as spin coating and thermal evaporation of precursors synthesized by methods such as drying, solutionizing, and hot injection.

However, in the case of thin film formation by thermal evaporation, it is difficult to produce a deposition source, degeneration of the deposition source may occur when forming a thin film over a long period of time, and deposition source losses are huge.

On the other hand, when a thin film is formed by spin coating, it is difficult to form a large-area thin film, and it is not possible to form patterns.

Light-emitting devices are self-emissive devices that, as compared with devices of the related art, have wide viewing angles, high contrast ratios, short response times, and excellent characteristics in terms of luminance, driving voltage, and response speed.

In a light-emitting device, a first electrode is located on a substrate, and a hole transport region, an emission layer, an electron transport region, and a second electrode are sequentially formed on the first electrode. Holes provided from the first electrode move toward the emission layer through the hole transport region, and electrons provided from the second electrode move toward the emission layer through the electron transport region. Carriers, such as holes and electrons, recombine in the emission layer to produce light.

The above information disclosed in this Background section is only for understanding of the background of the inventive concepts, and, therefore, it may contain information that does not constitute prior art.

SUMMARY

One or more embodiments relate to a method of forming a perovskite thin film wherein large-area thin film formation and pattern formation are possible and a light-emitting device includes a layer manufactured thereby.

Additional features of the inventive concepts will be set forth in the description that follows, and in part will be apparent from the description, or may be learned by practice of the inventive concepts.

According to one or more embodiments, a method of forming a perovskite thin film may include preparing a substrate, spraying a first solution of a first perovskite compound precursor through the inner nozzle of a dual nozzle including an inner nozzle and an outer nozzle, spraying a second solution of a second perovskite compound precursor through the outer nozzle, forming a perovskite compound solution by reacting the first solution of the first perovskite compound precursor and the second solution of the second perovskite compound precursor, forming a membrane on the substrate from the perovskite compound solution, and evaporating a solvent of the perovskite compound solution from the membrane on the substrate.

According to one or more embodiments, a light-emitting device may include a first electrode, a second electrode facing the first electrode, and an interlayer located between the first electrode and the second electrode and including an emission layer, wherein the interlayer may include a layer manufactured by the method of forming the perovskite thin film.

It is to be understood that both the foregoing general description and the following detailed description are illustrative and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate illustrative embodiments of the invention, and together with the description serve to explain the inventive concepts.

FIG. 3 are photographs illustrating surfaces of a thin film formed in the related art and a thin film formed by the method of forming a perovskite thin film according to an embodiment of the present disclosure.

DETAILED DESCRIPTION

Figure 1:
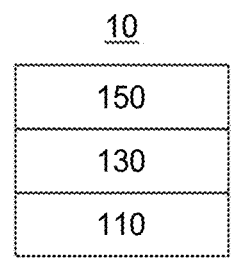
FIG. 1 is a schematic view illustrating a light-emitting device according to an embodiment of the present disclosure.

In the following description, for the purposes of explanation, numerous specific details are set forth in order to provide a thorough understanding of various embodiments or implementations of the invention. As used herein "embodiments" and "implementations" are interchangeable words that are non-limiting examples of devices or methods employing one or more of the inventive concepts disclosed herein. It is apparent, however, that various embodiments may be practiced without these specific details or with one or more equivalent arrangements. In other instances, well-known structures and devices are illustrated in block diagram form in order to avoid unnecessarily obscuring various embodiments. Further, various embodiments may be different, but do not have to be exclusive. For example, specific shapes, configurations, and characteristics of an embodiment may be used or implemented in another embodiment without departing from the inventive concepts.

Unless otherwise specified, the illustrated embodiments are to be understood as providing illustrative features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Reference will now be made in detail to embodiments, examples of which are illustrated in the accompanying drawings, wherein like reference numerals refer to like elements throughout the specification. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

A method of forming a perovskite thin film according to an embodiment of the disclosure includes preparing a substrate; spraying a first solution of a first perovskite compound precursor through an inner nozzle of a dual nozzle including the inner nozzle and an outer nozzle; spraying a second solution of a second perovskite compound precursor through the outer nozzle; forming a perovskite compound solution by reacting the first solution of the first perovskite compound precursor and the second solution of the second perovskite compound precursor; forming a membrane on the substrate from the perovskite compound solution; and evaporating a solvent of the perovskite compound solution from the membrane formed on the substrate.

In an embodiment, the perovskite compound may be a non-lead-based perovskite compound. In this case, the first perovskite compound precursor and the second perovskite compound precursor may not include lead.

When spraying the first solution of the first perovskite compound precursor through the inner nozzle and spraying the second solution of the second perovskite compound precursor through the outer nozzle, spraying the first solution of the first perovskite compound precursor through the inner nozzle may be performed before spraying the second solution of the second perovskite compound precursor through the outer nozzle, or spraying the first solution of the first perovskite compound precursor through the inner nozzle may be performed after spraying the second solution of the second perovskite compound precursor through the outer nozzle.

In an embodiment, spraying the first solution of the first perovskite compound precursor through the inner nozzle and spraying the second solution of the second perovskite compound precursor through the outer nozzle may be performed simultaneously.

In an embodiment, there may be a voltage difference between the substrate and the dual nozzle by application of an electric field. In this case, the substrate may be a material capable of flowing charges.

In addition, the substrate may be a rigid glass substrate, a flexible substrate (ultra thin glass (UTG), polyimide, and the like), and the like. When using a flexible substrate, continuous processing may be possible.

In an embodiment, the voltage difference may be 50 keV or less. For example, the difference between the substrate and the dual nozzle may be about 10 keV to about 50 keV. When the voltage difference exceeds 50 keV, a Taylor cone may not be formed at the end of an electrified nozzle and the precursor solution may be scattered. The voltage difference should be at least 10 keV for the Taylor cone to be formed at the end of the nozzle.

The first perovskite compound precursor may be a first metal halogen compound, the second perovskite compound precursor may be a second metal halogen compound, and, when desired, the first metal halogen compound and the second metal halogen compound may be the same metal halogen compound.

In an embodiment, the first perovskite compound precursor may be a first metal halogen compound, the second perovskite compound precursor may be a second metal halogen compound, and the first metal halogen compound and the second metal halogen compound may be different metal halogen compounds. The first metal halogen compound sprayed through the inner nozzle and the second metal halogen compound sprayed through the outer nozzle may be mixed and reacted until being reached to the substrate to form a perovskite compound.

The mixed first metal halogen compound and second metal halogen compound may form droplets, and the droplets may not agglomerate due to electromagnetic repulsion and be dried while moving to the substrate and may reach the substrate with only a minimum amount of solvent and be substantially completely dried to form a thin film.

The composition of the perovskite compound that forms the thin film on the substrate may be determined according to the first metal halogen compound and the second metal halogen compound.

In an embodiment, the first perovskite compound precursor may be a compound represented by Formula 1:

$$A_\alpha A'_{\alpha'} X \qquad \text{Formula 1}$$

wherein, in Formula 1, A and A' may each independently represent an alkali metal, an alkaline earth metal, or a lanthanide metal, X represents a halogen, and $\alpha$ and $\alpha'$ may each independently represent a number from 0 to 1.

For example, $\alpha$ and $\alpha'$ may be any number from 0 to 1 that indicates a ratio of A and A' relative to X to balance the charge of X, which is an anion. Formula 1 may be overall neutral.

For example, A and A' may each independently be K, Rb, Cs, Mg, La, Ce, or Dy. For example, X may be F, Cl, Br, or I.

$\alpha$ and $\alpha'$ in Formula 1 indicates the stoichiometric ratio for one X.

In an embodiment, the second perovskite compound precursor may be a compound represented by Formula 2:

$$B_\beta B'_{\beta'} X \qquad \text{Formula 2}$$

wherein, in Formula 1, B and B' each independently represent a transition metal or a post transition metal, X represents a halogen, and $\beta$ and $\beta'$ each independently represent a number from 0 to 1.

For example, $\beta$ and $\beta'$ may be any number from 0 to 1 that indicates a ratio of B and B' relative to X to balance the charge of X, which is an anion. Formula 2 may be overall neutral.

For example, B and B' may each independently be Ag, Cu, Ni, Ta, Bi, Sn, In, or Al. For example, X may be F, Cl, Br, or I.

$\beta$ and $\beta'$ in Formula 2 indicates the stoichiometric ratio for one X.

In an embodiment, the perovskite compound may be a compound represented by Formula 3:

$$A_\alpha A'_{\alpha'} B_\beta B'_{\beta'} X_\gamma \qquad \text{Formula 3}$$

wherein, in Formula 3, A, A', $\alpha$, and $\alpha'$ are as defined in Formula 1, B, B', $\beta$, and $\beta'$ are as defined in Formula 2, X represents a halogen, and $\gamma$ represents a number from 1 to 9.

For example, X may be F, Cl, Br, or I.

For example, the first metal halogen compound sprayed through the inner nozzle and the second metal halogen compound sprayed through the outer nozzle may be mixed and be reacted until being reached to the substrate to form a compound represented by Formula 3.

In an embodiment, the first metal halogen compound sprayed through the inner nozzle and the second metal halogen compound sprayed through the outer nozzle may be mixed and be reacted until being reached to the substrate to form a compound represented by Formula 4:

$$A_a Z \qquad \text{Formula 4}$$

wherein, in Formula 4, A may be a cation of an alkali metal, Z may be an anion, and a may be an integer of 1, 2, or 3.

For example, a may be 3, and Z may be $B_2X_5^{-3}$; a may be 2, and Z may be $BX_3^{-2}$; or a may be 1, and Z may be $B_2X_3^{-1}$. B may be Cu, Ag, or any combination thereof, and X may be F, Cl, Br, I, or any combination thereof.

For example, a may be 3, and Z may be $BX_5^{-3}$; a may be 2, and Z may be $BX_4^{-2}$; or a may be 1, and Z may be $B_2X_5^{-1}$. B may be Mn, Tl, Zn, Ni, Ce, Pr, Nd, Pm, Sm, Eu, Gd, Tb, Dy, Ho, Er, Tm, Yb, Lu, or any combination thereof, and X may be F, Cl, Br, I, or any combination thereof.

For example, a may be 3, and Z may be $BX_6^{-3}$; or a may be 2, and Z may be $BX_5^{-2}$. B may be In, Sb, Bi, Ce, Pr, Nd, Pm, Sm, Eu, Gd, Tb, Dy, Ho, Er, Tm, Yb, Lu, or any combination thereof, and X may be F, Cl, Br, I, or any combination thereof.

In an embodiment, the alkali metal may be Li, Na, K, Rb, Cs, Fr, or any combination thereof.

In an embodiment, the first solution may include a first solvent, the second solution may include a second solvent, and the first solvent and the second solvent may be organic solvents. For example, the organic solvent may have a boiling point of about 110° C. to about 200° C. When the temperature of the organic solvent is within the above range, a reaction of a mixed first precursor and a second precursor may occur, and removing the solvent may not be difficult. For example, the first solvent and the second solvent may be the same organic solvent.

For example, for easy removal of the solvent, the pressure of the system may be set to 1 atm or less, thereby evaporating the organic solution at a lower temperature.

In an embodiment, the organic solvent may be dimethylformamide (DMF), dimethyl sulfoxide (DMSO), o-dichlorobenzene, m-dichlorobenzene, p-dichlorobenzene, or any combination thereof.

In an embodiment, the temperature of the first solution may be about 15° C. to about 200° C.

In an embodiment, the temperature of the second solution may be about 15° C. to about 200° C.

When the temperature of the first solution and the temperature of the second solution are in the above range, a reaction of the mixed first precursor and the second precursor may occur.

In an embodiment, the concentration of the first solution may be about 0.01 M to about 1.0 M.

For example, the concentration of the first solution may be about 0.1 M to about 1.0 M.

In an embodiment, the concentration of the second solution may be about 0.01 M to about 1.0 M.

For example, the concentration of the second solution may be about 0.1 M to about 1.0 M.

When the concentration of the first solution and the concentration of the second solution are in the above range, adjusting the flow of the inner nozzle and outer nozzle may be easy by adjusting the pressure of the inner nozzle and outer nozzle.

In an embodiment, the temperature of the substrate may be 200° C. or less. When the temperature of the substrate is greater than 200° C., deterioration of other materials may occur. For example, the temperature of the substrate may be about 25° C. to about 200° C. For example, the temperature of the substrate may be about 50° C. to about 200° C.

For example, when the pressure of the system is set to 1 atm or less, the temperature of the substrate may be 150° C.

The first precursor and the second precursor may each independently be selected from LiF, NaF, KF, RbF, CsF, BeF2, MgF2, CaF2, SrF2, BaF2, YbF2, YbF3, SmF2, SmF3, EuF2, EuF3, TmF2, TmF3, CuF, TlF, AgF, CdF2, HgF2, SnF2, BiF3, ZnF2, MnF2, FeF2, GeF2, CoF2, NiF2, AlF3, ThF4, UF3, LiCl, NaCl, KCl, RbCl, CsCl, BeCl2, MgCl2, CaCl2, SrCl2, BaCl2, YbCl2, YbCl3, SmCl2, SmCl3, EuCl2, EuCl3, TmCl2, TmCl3, CuCi, TlCl, AgCl, CdCl2, HgCl2, SnCl2, BiCl3, ZnCl2, MnCl2, FeCl2, GeCl2, CoCl2, NiCl2, AlCl3, ThCl4, UCl3, LiBr, NaBr, KBr, RbBr, CsBr, BeBr2, MgBr2, CaBr2, SrBr2, BaBr2, YbBr2, YbBr3, SmBr2, SmBr3, EuBr2, EuBr3, TmBr2, TmBr3, CuBr, TlBr, AgBr, CdBr2, HgBr2, SnBr2, BiBr3, ZnBr2, MnBr2, FeBr2, GeBr2, CoBr2, NiBr2, AlBr3, ThBr4, UBr3, LiI, NaI, KI, RbI, CsI, BeI2, MgI2, CaI2, SrI2, BaI2, YbI2, YbI3, SmI2, SmI3, EuI2, EuI3, TmI2, TmI3, CuI, TlI, AgI, CdI2, HgI2, SnI2, BiI3, ZnI2, MnI2, FeI2, GeI2, CoI2, NiI2, AlI3, ThI4, UI3, or any combination thereof.

A light-emitting device according to another embodiment may include a layer manufactured by the method of forming a perovskite thin film.

In an embodiment, the layer manufactured by the method of forming a perovskite thin film may be a hole injection layer, a hole transport layer, a buffer layer, an emission layer, or an electron transport layer.

The term "interlayer" as used herein refers to a single layer and/or all of a plurality of layers located between a first electrode and a second electrode of a light-emitting device.

FIG. 1 is a schematic cross-sectional view illustrating a light-emitting device 10 according to an embodiment. The light-emitting device 10 includes a first electrode 110, an interlayer 130, and a second electrode 150.

Hereinafter, the structure of the light-emitting device 10 according to an embodiment and a method of manufacturing the light-emitting device 10 will be described in connection with FIG. 1.

In FIG. 1, a substrate (not illustrated) may be additionally located under the first electrode 110 or above the second electrode 150. As the substrate, a glass substrate or a plastic substrate may be used. In one or more embodiments, the substrate may be a flexible substrate, and may include plastics with excellent heat resistance and durability, such as polyimide, polyethylene terephthalate (PET), polycarbonate, polyethylene napthalate, polyarylate (PAR), polyetherimide, or any combination thereof.

The first electrode 110 may be formed by, for example, depositing or sputtering a material for forming the first electrode 110 on the substrate. When the first electrode 110 is an anode, a material for forming the first electrode 110 may be a high work function material that facilitates injection of holes.

The first electrode 110 may be a reflective electrode, a semi-transmissive electrode, or a transmissive electrode. When the first electrode 110 is a transmissive electrode, a material for forming the first electrode 110 may include indium tin oxide (ITO), indium zinc oxide (IZO), tin oxide (SnO2), zinc oxide (ZnO), or any combinations thereof.

The first electrode 110 may have a single-layered structure consisting of a single layer or a multi-layered structure including a plurality of layers. For example, the first electrode 110 may have a three-layered structure of ITO/Ag/ITO.

An apparatus as described herein may include an interlayer 130.

The interlayer 130 may be located on the first electrode 110. The interlayer 130 may include an emission layer.

The interlayer 130 may further include a hole transport region placed between the first electrode 110 and the emission layer and an electron transport region placed between the emission layer and the second electrode 150.

The interlayer 130 may further include, in addition to various organic materials, metal-containing compounds such as organometallic compounds, inorganic materials such as quantum dots, and the like.

In one or more embodiments, the interlayer 130 may include i) two or more emission layers sequentially stacked between the first electrode 110 and the second electrode 150 and ii) a charge generation layer located between the two or more emission layers. When the interlayer 130 includes the emission layer and the charge generation layer as described above, the light-emitting device 10 may be a tandem light-emitting device.

A hole transport region may be included in interlayer 130.

The hole transport region may have: i) a single-layered structure consisting of a single layer consisting of a single material, ii) a single-layered structure consisting of a single layer consisting of a plurality of different materials, or iii) a multi-layered structure including a plurality of layers including different materials.

The hole transport region may include a hole injection layer, a hole transport layer, an emission auxiliary layer, an electron blocking layer, or any combination thereof.

For example, the hole transport region may have a multi-layered structure including a hole injection layer/hole transport layer structure, a hole injection layer/hole transport layer/emission auxiliary layer structure, a hole injection layer/emission auxiliary layer structure, a hole transport layer/emission auxiliary layer structure, or a hole injection layer/hole transport layer/electron blocking layer structure, wherein, in each structure, layers are stacked sequentially from the first electrode 110.

The hole transport region may include a compound represented by Formula 201, a compound represented by Formula 202, or any combination thereof:

Formula 201

$$R_{201}-(L_{201})_{xa1}-N{\Large\begin{matrix}(L_{202})_{xa2}-R_{202}\\ (L_{203})_{xa3}-R_{203}\end{matrix}}$$

Formula 202

$$R_{201}-(L_{201})_{xa1}\diagdown\atop R_{202}-(L_{202})_{xa2}\diagup N-(L_{205})_{xa5}-\left[N{\Large\begin{matrix}(L_{203})_{xa3}-R_{203}\\ (L_{204})_{xa4}-R_{204}\end{matrix}}\right]_{na1}$$

wherein, in Formulae 201 and 202, $L_{201}$ to $L_{204}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, $L_{205}$ may be *—O—*', *—S—*', *—N($Q_{201}$)-*', a $C_1$-$C_{20}$ alkylene group unsubstituted or substituted with at least one $R_{10a}$, a $C_2$-$C_{20}$ alkenylene group unsubstituted or substituted with at least one $R_{10a}$, a $C_3$-$C_{60}$ carbocyclic group unsubstituted or substituted with at least one $R_{10a}$, or a $C_1$-$C_{60}$ heterocyclic group unsubstituted or substituted with at least one $R_{10a}$, xa1 to xa4 may each independently be an integer from 0 to 5, xa5 may be an integer from 1 to 10, $R_{201}$ to $R_{204}$ and $Q_{201}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, $R_{201}$ and $R_{202}$ may optionally be linked to each other, via a single bond, a $C_1$-$C_5$ alkylene group unsubstituted or substituted with at least one $R_{10a}$, or a $C_2$-$C_5$ alkenylene group unsubstituted or substituted with at least one $R_{10a}$, to form a $C_8$-$C_{60}$ polycyclic group (for example, a carbazole group or the like) unsubstituted or substituted with at least one $R_{10a}$ (for example, Compound HT16), $R_{203}$ and $R_{204}$ may optionally be linked to each other, via a single bond, a $C_1$-$C_5$ alkylene group unsubstituted or substituted with at least one $R_{10a}$, or a $C_2$-$C_5$ alkenylene group unsubstituted or substituted with at least one $R_{10a}$, to form a $C_8$-$C_{60}$ polycyclic group unsubstituted or substituted with at least one $R_{10a}$, and na1 may be an integer from 1 to 4.

In one or more embodiments, each of Formulae 201 and 202 may include at least one of groups represented by Formulae CY201 to CY217.

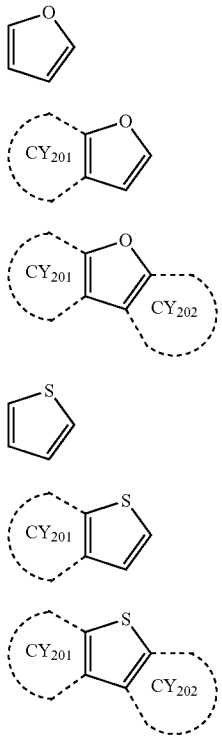

CY212

CY213

CY214

CY215

CY216

CY217

$R_{10b}$ and $R_{10c}$ in Formulae CY201 to CY217 are the same as described in connection with $R_{10a}$, ring $CY_{201}$ to ring $CY_{204}$ may each independently be a $C_3$-$C_{20}$ carbocyclic group or a $C_1$-$C_{20}$ heterocyclic group, and at least one hydrogen in Formulae CY201 to CY217 may be unsubstituted or substituted with $R_{10a}$.

In one or more embodiments, ring $CY_{201}$ to ring $CY_{204}$ in Formulae CY201 to CY217 may each independently be a benzene group, a naphthalene group, a phenanthrene group, or an anthracene group.

In one or more embodiments, each of Formulae 201 and 202 may include at least one of groups represented by Formulae CY201 to CY203.

In one or more embodiments, Formula 201 may include at least one of groups represented by Formulae CY201 to CY203 and at least one of groups represented by Formulae CY204 to CY217.

In one or more embodiments, xa1 in Formula 201 may be 1, $R_{201}$ may be a group represented by one of Formulae CY201 to CY203, xa2 may be 0, and $R_{202}$ may be a group represented by one of Formulae CY204 to CY207.

In one or more embodiments, each of Formulae 201 and 202 may not include a group represented by one of Formulae CY201 to CY203.

In one or more embodiments, each of Formulae 201 and 202 may not include a group represented by one of Formulae CY201 to CY203, and may include at least one of groups represented by Formulae CY204 to CY217.

In one or more embodiments, each of Formulae 201 and 202 may not include a group represented by one of Formulae CY201 to CY217.

For example, the hole transport region may include m-MTDATA, TDATA, 2-TNATA, NPB(NPD), β-NPB, TPD, Spiro-TPD, Spiro-NPB, methylated-NPB, TAPC, HMTPD, 4,4',4"-tris(N-carbazolyl)triphenylamine (TCTA), polyaniline/dodecylbenzenesulfonic acid (PANI/DBSA), poly(3,4-ethylenedioxythiophene)/poly(4-styrenesulfonate) (PEDOT/PSS), polyaniline/camphor sulfonic acid (PANI/CSA), polyaniline/poly(4-styrenesulfonate) (PANI/PSS), or any combination thereof.

A thickness of the hole transport region may be in a range of about 50 Å to about 10,000 Å, for example, about 100 Å to about 4,000 Å. When the hole transport region includes a hole injection layer, a hole transport layer, or any combination thereof, a thickness of the hole injection layer may be in a range of about 100 Å to about 9,000 Å, for example, about 100 Å to about 1,000 Å, and a thickness of the hole transport layer may be in a range of about 50 Å to about 2,000 Å, for example, about 100 Å to about 1,500 Å. When the thicknesses of the hole transport region, the hole injection layer, and the hole transport layer are within these ranges, satisfactory hole transporting characteristics may be obtained without a substantial increase in driving voltage.

The emission auxiliary layer may increase light-emission efficiency by compensating for an optical resonance distance according to the wavelength of light emitted by an emission layer, and the electron blocking layer may block the leakage of electrons from an emission layer to a hole transport region. Materials that may be included in the hole transport region may be included in the emission auxiliary layer and the electron blocking layer.

For example, the hole injection layer or hole transport layer may be a layer manufactured by the method of forming the perovskite thin film according to an embodiment.

There may be an emission layer disposed in interlayer 130.

When the light-emitting device 10 is a full-color light-emitting device, the emission layer may be patterned into a red emission layer, a green emission layer, and/or a blue emission layer, according to a sub-pixel. In one or more embodiments, the emission layer may have a stacked structure of two or more layers of a red emission layer, a green emission layer, and a blue emission layer, in which the two or more layers contact each other or are separated from each other. In one or more embodiments, the emission layer may include two or more materials of a red light-emitting material, a green light-emitting material, and a blue light-emitting material, in which the two or more materials are mixed with each other in a single layer to emit white light.

The emission layer may include a host and a dopant. The dopant may include a phosphorescent dopant, a fluorescent dopant, or any combination thereof.

The amount of the dopant in the emission layer may be from about 0.01 to about 15 parts by weight based on 100 parts by weight of the host.

In one or more embodiments, the emission layer may include a quantum dot.

Meanwhile, the emission layer may include a delayed fluorescence material. The delayed fluorescence material may act as a host or a dopant in the emission layer.

A thickness of the emission layer may be in a range of about 100 Å to about 1,000 Å, for example, about 200 Å to about 600 Å. When the thickness of the emission layer is within these ranges, excellent light-emission characteristics may be obtained without a substantial increase in driving voltage.

For example, the emission layer may be layer manufactured by the method of forming the perovskite thin film according to an embodiment.

A host may be used.

In one or more embodiments, the host may include a compound represented by Formula 301 below:

$$[Ar_{301}]_{xb11}\text{-}[(L_{301})_{xb1}\text{-}R_{301}]_{xb21}$$  Formula 301 wherein, in Formula 301, $Ar_{301}$ and $L_{301}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, xb11 may be 1, 2, or 3, xb1 may be an integer from 0 to 5, $R_{301}$ may be hydrogen, deuterium, —F, —Cl, —Br, —I, a hydroxyl group, a cyano group, a nitro group, a $C_1$-$C_{60}$ alkyl group unsubstituted or substituted with at least one $R_{10a}$, a $C_2$-$C_{60}$ alkenyl group unsubstituted or substituted with at least one $R_{10a}$, a $C_2$-$C_{60}$ alkynyl group unsubstituted or substituted with at least one $R_{10a}$, a $C_1$-$C_{60}$ alkoxy group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, —Si($Q_{301}$)($Q_{302}$)($Q_{303}$), —N($Q_{301}$)($Q_{302}$), —B($Q_{301}$)($Q_{302}$), —C(=O)($Q_{301}$), —S(=O)$_2$($Q_{301}$), or —P(=O)($Q_{301}$)($Q_{302}$), xb21 may be an integer from 1 to 5, and $Q_{301}$ to $Q_{303}$ are each the same as described in connection with $Q_{11}$ of the present specification.

For example, when xb11 in Formula 301 is 2 or more, two or more of $Ar_{301}$(s) may be linked to each other via a single bond.

In one or more embodiments, the host may include a compound represented by Formula 301-1, a compound represented by Formula 301-2, or any combination thereof:

wherein, in Formulae 301-1 and 301-2, ring $A_{301}$ to ring $A_{304}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, $X_{301}$ may be O, S, N-[($L_{304}$)$_{xb4}$-$R_{304}$], C($R_{304}$)($R_{305}$), or Si($R_{304}$)($R_{305}$), xb22 and xb23 may each independently be 0, 1, or 2, $L_{301}$, xb1, and $R_{301}$ are each the same as described in the present specification, $L_{302}$ to $L_{304}$ are each independently the same as described in connection with $L_{301}$, xb2 to xb4 may each independently be the same as described in connection with xb1, and $R_{302}$ to $R_{305}$ and $R_{311}$ to $R_{314}$ are each the same as described in connection with $R_{301}$.

In one or more embodiments, the host may include an alkali earth metal complex, a post-transition metal complex, or any combination thereof. In one or more embodiments, the host may include a Be complex (for example, Compound H55), an Mg complex, a Zn complex, or any combination thereof.

In one or more embodiments, the host may include 9,10-di(2-naphthyl)anthracene (ADN), 2-methyl-9,10-bis(naphthalen-2-yl)anthracene (MADN), 9,10-di-(2-naphthyl)-2-t-butyl-anthracene (TBADN), 4,4'-bis(N-carbazolyl)-1,1'-biphenyl (CBP), 1,3-di-9-carbazolylbenzene (mCP), 1,3,5-tri(carbazol-9-yl)benzene (TCP), or any combination thereof.

A phosphorescent dopant may be used.

The phosphorescent dopant may include at least one transition metal as a central metal.

The phosphorescent dopant may include a monodentate ligand, a bidentate ligand, a tridentate ligand, a tetradentate ligand, a pentadentate ligand, a hexadentate ligand, or any combination thereof.

The phosphorescent dopant may be electrically neutral.

For example, the phosphorescent dopant may include an organometallic compound represented by Formula 401:

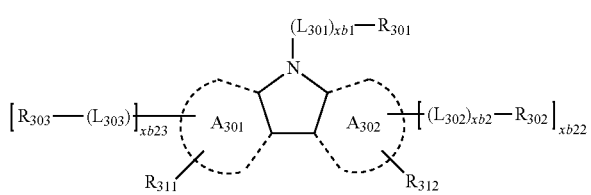

Formula 301-1

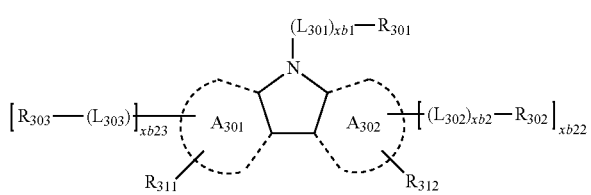

Formula 301-2

Formula 401

$$M(L_{401})_{xc1}(L_{402})_{xc2}$$

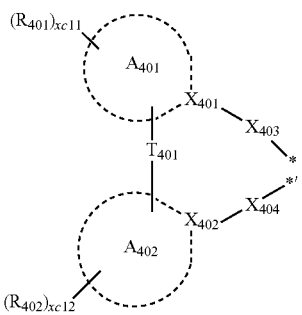

Formula 402 wherein, in Formulae 401 and 402,

M may be transition metal (for example, iridium (Ir), platinum (Pt), palladium (Pd), osmium (Os), titanium (Ti), gold (Au), hafnium (Hf), europium (Eu), terbium (Tb), rhodium (Rh), rhenium (Re), or thulium (Tm)), $L_{401}$ may be a ligand represented by Formula 402, and xc1 may be 1, 2, or 3, wherein when xc1 is 2 or more, two or more of $L_{401}$(s) may be identical to or different from each other, $L_{402}$ may be an organic ligand, xc2 may be 0, 1, 2, 3, or 4, and when xc2 is 2 or more, two or more of $L_{402}$(s) may be identical to or different from each other, $X_{401}$ and $X_{402}$ may each independently be nitrogen or carbon, ring $A_{401}$ and ring $A_{402}$ may each independently be a $C_3$-$C_{60}$ carbocyclic group or a $C_1$-$C_{60}$ heterocyclic group, $T_{401}$ may be a single bond, —O—, —S—, —C(=O)—, —N($Q_{411}$)-, —C($Q_{411}$)($Q_{412}$)-, —C($Q_{411}$)=C($Q_{412}$)-, —C($Q_{411}$)=, or =C($Q_{411}$)=, $X_{403}$ and $X_{404}$ may each independently be a chemical bond (for example, a covalent bond or a coordination bond), O, S, N($Q_{413}$), B($Q_{413}$), P($Q_{413}$), C($Q_{413}$)($Q_{414}$), or Si($Q_{413}$)($Q_{414}$), $Q_{411}$ to $Q_{414}$ are the same as described in connection with $Q_1$, $R_{401}$ and $R_{402}$ may each independently be hydrogen, deuterium, —F, —Cl, —Br, —I, a hydroxyl group, a cyano group, a nitro group, a $C_1$-$C_{20}$ alkyl group unsubstituted or substituted with at least one $R_{10a}$, a $C_1$-$C_{20}$ alkoxy group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, —Si($Q_{401}$)($Q_{402}$)($Q_{403}$), —N($Q_{401}$)($Q_{402}$), —B($Q_{401}$)($Q_{402}$), —C(=O)($Q_{401}$), —S(=O)$_2$($Q_{401}$), or —P(=O)($Q_{401}$)($Q_{402}$), $Q_{401}$ to $Q_{403}$ are the same as described in connection with $Q_1$, xc11 and xc12 may each independently be an integer from 0 to 10, and

* and *' in Formula 402 each indicate a binding site to M in Formula 401.

For example, in Formula 402, i) $X_{401}$ may be nitrogen, and $X_{402}$ may be carbon, or ii) each of $X_{401}$ and $X_{402}$ may be nitrogen.

In one or more embodiments, when xc1 in Formula 402 is 2 or more, two ring $A_{401}$(s) in two or more of $L_{401}$(s) may be optionally linked to each other via $T_{402}$, which is a linking group, and two ring $A_{402}$(s) may be optionally linked to each other via $T_{403}$, which is a linking group (see Compounds PD1 to PD4 and PD7). $T_{402}$ and $T_{403}$ are the same as described in connection with $T_{401}$.

$L_{402}$ in Formula 401 may be an organic ligand. For example, $L_{402}$ may include a halogen group, a diketone group (for example, an acetylacetonate group), a carboxylic acid group (for example, a picolinate group), —C(=O), an isonitrile group, a —CN group, a phosphorus group (for example, a phosphine group, a phosphite group, etc.), or any combination thereof.

A fluorescent dopant may be used.

The fluorescent dopant may include an amine group-containing compound, a styryl group-containing compound, or any combination thereof.

In one or more embodiments, the fluorescent dopant may include a compound represented by Formula 501:

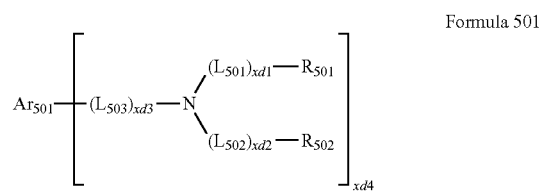

Formula 501 wherein, in Formula 501, $Ar_{501}$, $L_{501}$ to $L_{503}$, $R_{501}$, and $R_{502}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, xd1 to xd3 may each independently be 0, 1, 2, or 3, and xd4 may be 1, 2, 3, 4, 5, or 6.

In one or more embodiments, $Ar_{501}$ in Formula 501 may be a condensed cyclic group (for example, an anthracene group, a chrysene group, or a pyrene group) in which three or more monocyclic groups are condensed together.

In one or more embodiments, xd4 in Formula 501 may be 2.

For example, the fluorescent dopant may be DPVBi, DPAVBi, or any combination thereof.

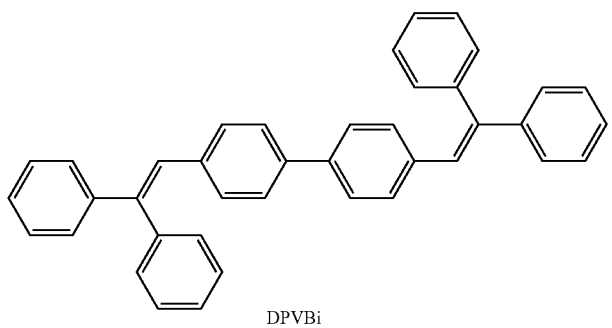
DPVBi

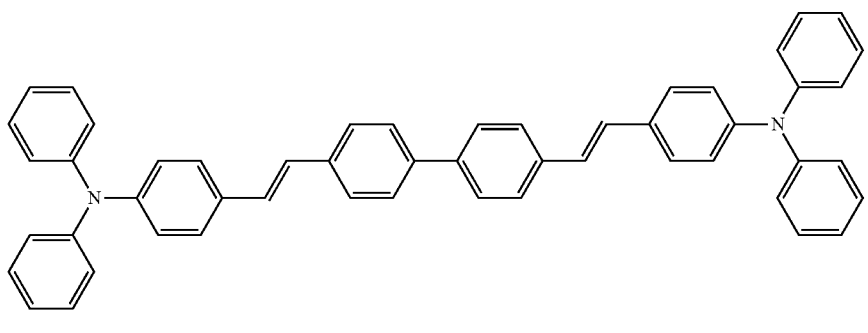
DPAVBi

The emission layer may include a delayed fluorescence material.

In the present specification, the delayed fluorescence material may be selected from compounds capable of emitting delayed fluorescent light based on a delayed fluorescence emission mechanism.

The delayed fluorescence material included in the emission layer may act as a host or a dopant depending on the type of other materials included in the emission layer.

In one or more embodiments, the difference between the triplet energy level (eV) of the delayed fluorescence material and the singlet energy level (eV) of the delayed fluorescence material may be greater than or equal to 0 eV and less than or equal to 0.5 eV. When the difference between the triplet energy level (eV) of the delayed fluorescence material and the singlet energy level (eV) of the delayed fluorescence material satisfies the above-described range, up-conversion from the triplet state to the singlet state of the delayed fluorescence materials may effectively occur, and thus, the emission efficiency of the light-emitting device 10 may be improved.

In one or more embodiments, the delayed fluorescence material may include i) a material including at least one electron donor (for example, a π electron-rich $C_3$-$C_{60}$ cyclic group, such as a carbazole group) and at least one electron acceptor (for example, a sulfoxide group, a cyano group, or a π electron-deficient nitrogen-containing $C_1$-$C_{60}$ cyclic group), and ii) a material including a $C_8$-$C_{60}$ polycyclic group in which two or more cyclic groups are condensed while sharing boron (B).

In one or more embodiments, the delayed fluorescence material may include at least one of Compounds DF1 to DF9:

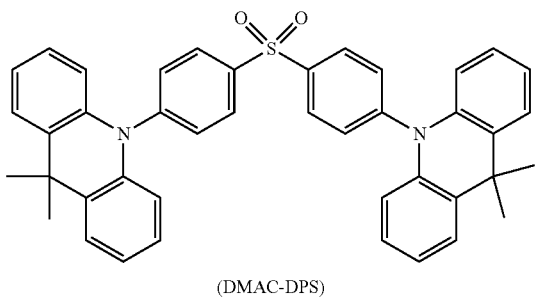
(DMAC-DPS)

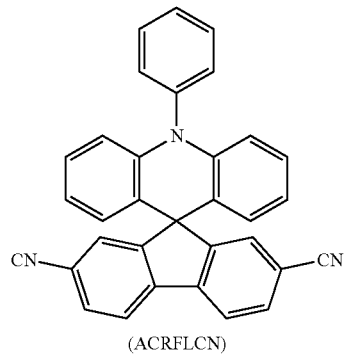
(ACRFLCN)

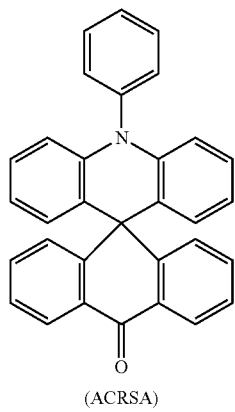

(ACRSA)

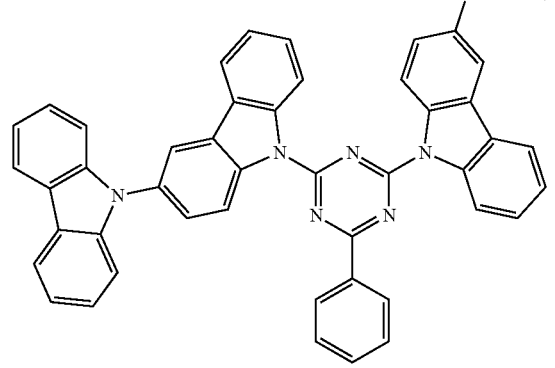

(CC2TA)

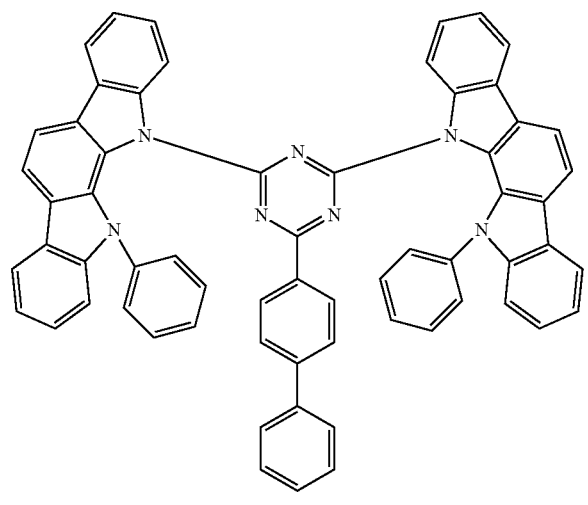

(PIC-TRZ)

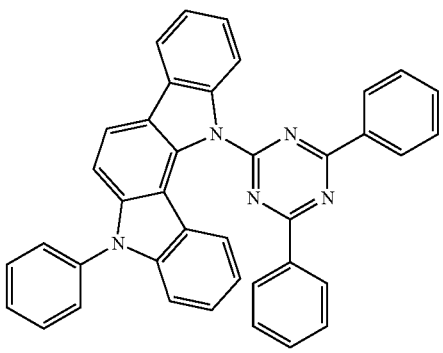

(PIC-TRZ2)

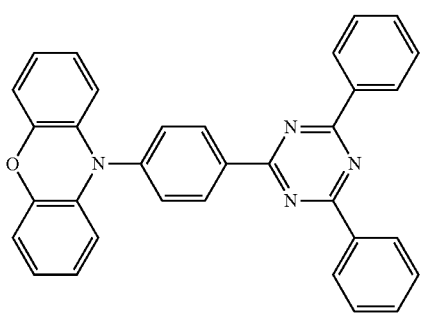

(PXZ-TRZ)

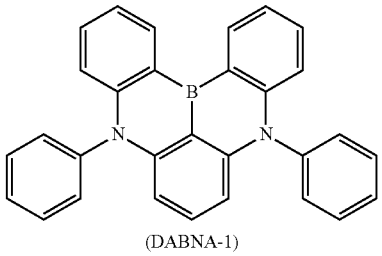

(DABNA-1)

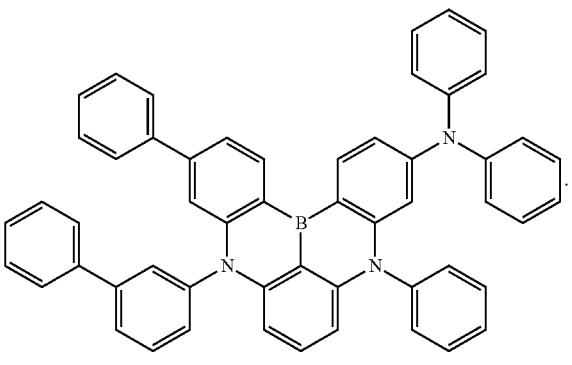

(DABNA-2)

The emission layer may include a quantum dot.

In the present specification, a quantum dot refers to a crystal of a semiconductor compound, and may include any material capable of emitting light of various emission wavelengths according to the size of the crystal.

A diameter of the quantum dot may be, for example, in a range of about 1 nm to about 10 nm.

The quantum dot may be synthesized by a wet chemical process, a metal organic chemical vapor deposition process, a molecular beam epitaxy process, or any process similar thereto.

According to the wet chemical process, a precursor material is mixed with an organic solvent to grow a quantum dot particle crystal. When the crystal grows, the organic solvent naturally acts as a dispersant coordinated on the surface of the quantum dot crystal and controls the growth of the crystal such that the growth of quantum dot particles may be controlled through a process which is more easily performed than vapor deposition methods, such as metal organic chemical vapor deposition (MOCVD) or molecular beam epitaxy (MBE), and which includes low costs.

The quantum dot may include Group II-VI semiconductor compound, Group III-V semiconductor compound, Group III-VI semiconductor compound, Group I-III-VI semiconductor compound, Group IV-VI semiconductor compound, Group IV element or compound; or any combination thereof.

Examples of the Group II-VI semiconductor compound may include a binary compound, such as CdSe, CdTe, ZnS, ZnSe, ZnTe, ZnO, HgS, HgSe, HgTe, MgSe, or MgS; a ternary compound, such as CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, or MgZnS; a quaternary compound, such as CdZnSeS, CdZnSeTe, CdZnSTe, CdHgSeS, CdHgSeTe, CdHgSTe, HgZnSeS, HgZnSeTe, or HgZnSTe; or any combination thereof.

Examples of the Group III-V semiconductor compound may include a binary compound, such as GaN, GaP, GaAs, GaSb, AlN, AlP, AlAs, AlSb, InN, InP, InAs, InSb, or the like; a ternary compound, such as GaNP, GaNAs, GaNSb, GaPAs, GaPSb, AlNP, AlNAs, AlNSb, AlPAs, AlPSb, InGaP, InNP, InAlP, InNAs, InNSb, InPAs, InPSb, GaAlNP, or the like; a quaternary compound, such as GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, or the like; or any combination thereof. Meanwhile, the Group III-V semiconductor compound may further include Group II elements. Examples of the Group III-V semiconductor compound further including the Group II element may include InZnP, InGaZnP, InAlZnP, etc.

Examples of the Group III-VI semiconductor compound may include: a binary compound, such as GaS, GaSe, $Ga_2Se_3$, GaTe, InS, InSe, $In_2S_3$, $In_2Se_3$, or InTe; a ternary compound, such as $InGaS_3$, or $InGaSe_3$; and any combination thereof.

Examples of the Group I-III-VI semiconductor compound may include: a ternary compound, such as $AgInS$, $AgInS_2$, $CuInS$, $CuInS_2$, $CuGaO_2$, $AgGaO_2$, or $AgAlO_2$; or any combination thereof.

Examples of the Group IV-VI semiconductor compound may include: a binary compound, such as SnS, SnSe, SnTe, PbS, PbSe, or PbTe; a ternary compound, such as SnSeS, SnSeTe, SnSTe, PbSeS, PbSeTe, PbSTe, SnPbS, SnPbSe, or SnPbTe; a quaternary compound, such as SnPbSSe, SnPbSeTe, or SnPbSTe; or any combination thereof.

The Group IV element or compound may include: a single element compound, such as Si or Ge; a binary compound, such as SiC or SiGe; or any combination thereof.

Each element included in a multi-element compound such as the binary compound, the ternary compound, and the quaternary compound, may exist at a uniform concentration or non-uniform concentration in a particle.

Meanwhile, the quantum dot may have a single structure or a dual core-shell structure. In the case of the quantum dot having a single structure, the concentration of each element included in the corresponding quantum dot may be uniform. In one or more embodiments, the material contained in the core and the material contained in the shell may be different from each other.

The shell of the quantum dot may act as a protective layer to prevent chemical degeneration of the core to maintain semiconductor characteristics and/or as a charging layer to impart electrophoretic characteristics to the quantum dot. The shell may be a single layer or a multi-layer. The interface between the core and the shell may have a concentration gradient in which the concentration of an element existing in the shell is decreased as the element is located closer to the center of the core.

Examples of the shell of the quantum dot may be include oxide of metal, metalloid, or non-metal, a semiconductor compound, and any combination thereof. Examples of the oxide of metal, metalloid, or non-metal may include a binary compound, such as $SiO_2$, $Al_2O_3$, $TiO_2$, ZnO, MnO, $Mn_2O_3$, $Mn_3O_4$, CuO, FeO, $Fe_2O_3$, $Fe_3O_4$, CoO, $Co_3O_4$, or NiO; a ternary compound, such as $MgAl_2O_4$, $CoFe_2O_4$, $NiFe_2O_4$, or $CoMn_2O_4$; and any combination thereof. Examples of the semiconductor compound may include, as described herein, Group II-VI semiconductor compound; Group III-V semiconductor compound; Group III-VI semiconductor compound; Group I-III-VI semiconductor compound; Group IV-VI semiconductor compound; and any combination thereof. In addition, the semiconductor compound may include CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, AlSb, or any combination thereof.

A full width at half maximum (FWHM) of an emission wavelength spectrum of the quantum dot may be about 45 nm or less, for example, about 40 nm or less, for example, about 30 nm or less, and within these ranges, color purity or color gamut may be increased. In addition, because the light emitted through the quantum dot is emitted in all directions, the wide viewing angle may be improved.

In addition, the quantum dot may be a spherical particle, a pyramidal particle, a multi-arm particle, a cubic nanoparticle, a nanotube particle, a nanowire particle, a nanofiber particle, or a nanoplate particle.

Because the energy band gap may be adjusted by controlling the size of the quantum dot, light having various wavelength bands may be obtained from the quantum dot emission layer. Accordingly, by using quantum dots of different sizes, a light-emitting device that emits light of various wavelengths may be implemented. In one or more embodiments, the size of the quantum dot may be selected to emit red, green and/or blue light. In addition, the size of the quantum dot may be configured to emit white light by combining light of various colors.

An electron transport region may be disposed in interlayer 130

The electron transport region may have: i) a single-layered structure consisting of a single layer consisting of a single material, ii) a single-layered structure consisting of a single layer consisting of a plurality of different materials, or iii) a multi-layered structure including a plurality of layers including different materials.

The electron transport region may include a buffer layer, a hole blocking layer, an electron transport layer, an electron injection layer, or any combination thereof.

In an embodiment, the electron transport region may have an electron transport layer/electron injection layer structure, a hole blocking layer/electron transport layer/electron injection layer structure, or a buffer layer/electron transport layer/electron injection layer structure, wherein, for each structure, constituting layers are sequentially stacked from an emission layer.

The electron transport region (for example, the buffer layer, the hole blocking layer, or the electron transport layer in the electron transport region) may include a metal-free compound including at least one π electron-deficient nitrogen-containing $C_1$-$C_{60}$ cyclic group.

In an embodiment, the electron transport region may include a compound represented by Formula 601 below:

$$[Ar_{601}]_{xe11}-[(L_{601})_{xe1}-R_{601}]_{xe21} \quad \text{Formula 601}$$

wherein, in Formula 601, $Ar_{601}$ and $L_{601}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, xe11 may be 1, 2, or 3, xe1 may be 0, 1, 2, 3, 4, or 5, $R_{601}$ may be a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, —Si($Q_{601}$)($Q_{602}$)($Q_{603}$), —C(=O)($Q_{601}$), —S(=O)$_2$($Q_{601}$), or —P(=O)($Q_{601}$)($Q_{602}$), $Q_{601}$ to $Q_{603}$ are the same as described in connection with $Q_1$, xe21 may be 1, 2, 3, 4, or 5, and at least one of $Ar_{601}$, $L_{601}$, and $R_{601}$ may each independently be a π electron-deficient nitrogen-containing $C_1$-$C_{60}$ cyclic group unsubstituted or substituted with at least one $R_{10a}$.

For example, when xe11 in Formula 601 is 2 or more, two or more of $Ar_{601}$(s) may be linked to each other via a single bond.

In one or more embodiments, $Ar_{601}$ in Formula 601 may be a substituted or unsubstituted anthracene group.

In an embodiment, the electron transport region may include a compound represented by Formula 601-1:

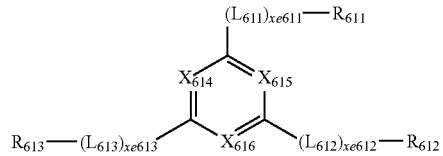

Formula 601-1 wherein, in Formula 601-1, $X_{614}$ may be N or C($R_{614}$), $X_{615}$ may be N or C($R_{615}$), $X_{616}$ may be N or C($R_{616}$), and at least one of $X_{614}$ to $X_{616}$ may be N, $L_{611}$ to $L_{613}$ are each the same as described in connection with $L_{601}$, xe611 to xe613 are each the same as described in connection with xe1, $R_{611}$ to $R_{613}$ are each the same as described in connection with $R_{601}$, and $R_{614}$ to $R_{616}$ may each independently be hydrogen, deuterium, —F, —Cl, —Br, —I, a hydroxyl group, a cyano group, a nitro group, a $C_1$-$C_{20}$ alkyl group, a $C_1$-$C_{20}$ alkoxy group, a $C_3$-$C_{60}$ carbocyclic group unsubstituted or substituted with at least one $R_{10a}$, or a $C_1$-$C_{60}$ heterocyclic group unsubstituted or substituted with at least one $R_{10a}$.

For example, xe1 and xe611 to xe613 in Formulae 601 and 601-1 may each independently be 0, 1, or 2.

The electron transport region may include 2,9-dimethyl-4,7-diphenyl-1,10-phenanthroline (BCP), bphen(4,7-diphenyl-1,10-phenanthroline), $Alq_3$, BAlq, TAZ, NTAZ, or any combination thereof:

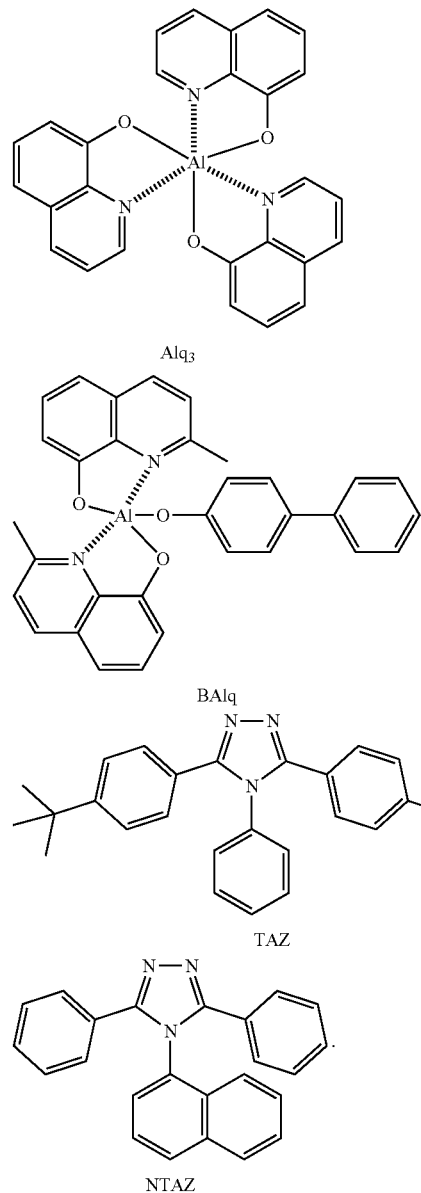

A thickness of the electron transport region may be from about 100 Å to about 5,000 Å, for example, about 160 Å to about 4,000 Å. When the electron transport region includes the hole blocking layer, the electron transport layer, or any combination thereof, a thickness of the hole blocking layer or electron transport layer may each independently be from about 20 Å to about 1,000 Å, for example, about 30 Å to about 300 Å, and the thickness of the electron transport layer may be from about 100 Å to about 1,000 Å, for example, about 150 Å to about 500 Å. When the thicknesses of the hole blocking layer and/or the electron transport layer are within these ranges, satisfactory electron transporting characteristics may be obtained without a substantial increase in driving voltage.

For example, the buffer layer and the electron transport layer may be manufactured by the method of forming the perovskite thin film according to an embodiment.

The electron transport region (for example, the electron transport layer in the electron transport region) may further include, in addition to the materials described above, a metal-containing material.

The metal-containing material may include an alkali metal complex, an alkaline earth metal complex, or any combination thereof. The metal ion of an alkali metal complex may be a Li ion, a Na ion, a K ion, a Rb ion, or a Cs ion, and the metal ion of an alkaline earth metal complex may be a Be ion, a Mg ion, a Ca ion, a Sr ion, or a Ba ion. A ligand coordinated with the metal ion of the alkali metal complex or the alkaline earth-metal complex may include a hydroxyquinoline, a hydroxyisoquinoline, a hydroxybenzoquinoline, a hydroxyacridine, a hydroxyphenanthridine, a hydroxyphenyloxazole, a hydroxyphenylthiazole, a hydroxyphenyloxadiazole, a hydroxyphenylthiadiazole, a hydroxyphenylpyridine, a hydroxyphenylbenzimidazole, a hydroxyphenylbenzothiazole, a bipyridine, a phenanthroline, a cyclopentadiene, or any combination thereof.

For example, the metal-containing material may include a Li complex. The Li complex may include, for example, Compound ET-D1 (LiQ) or ET-D2:

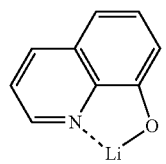

ET-D1

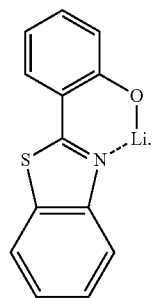

ET-D2

The electron transport region may include an electron injection layer that facilitates the injection of electrons from the second electrode 150. The electron injection layer may directly contact the second electrode 150.

The electron injection layer may have: i) a single-layered structure consisting of a single layer consisting of a single material, ii) a single-layered structure consisting of a single layer consisting of a plurality of different materials, or iii) a multi-layered structure including a plurality of layers including different materials.

The electron injection layer may include an alkali metal, alkaline earth metal, a rare earth metal, an alkali metal-containing compound, alkaline earth metal-containing compound, a rare earth metal-containing compound, an alkali metal complex, an alkaline earth metal complex, a rare earth metal complex, or any combination thereof.

The alkali metal may include Li, Na, K, Rb, Cs, or any combination thereof. The alkaline earth metal may include Mg, Ca, Sr, Ba, or any combination thereof. The rare earth metal may include Sc, Y, Ce, Tb, Yb, Gd, or any combination thereof.

The alkali metal-containing compound, the alkaline earth metal-containing compound, and the rare earth metal-containing compound may be oxides, halides (for example, fluorides, chlorides, bromides, or iodides), or tellurides of the alkali metal, the alkaline earth metal, and the rare earth metal, or any combination thereof.

The alkali metal-containing compound may include alkali metal oxides such as $Li_2O$, $Cs_2O$, or $K_2O$, and alkali metal halides such as LiF, NaF, CsF, KF, LiI, NaI, CsI, KI, or any combination thereof. The alkaline earth metal-containing compound may include an alkaline earth metal compound, such as BaO, SrO, CaO, $Ba_xSr_{1-x}O$ (x is a real number satisfying the condition of 0<x<1), $Ba_xCa_{1-x}O$ (x is a real number satisfying the condition of 0<x<1), and the like. The rare earth metal-containing compound may include $YbF_3$, $ScF_3$, $Sc_2O_3$, $Y_2O_3$, $Ce_2O_3$, $GdF_3$, $TbF_3$, $YbI_3$, $ScI_3$, $TbI_3$, or any combination thereof. In one or more embodiments, the rare earth metal-containing compound may include lanthanide metal telluride. Examples of the lanthanide metal telluride may be LaTe, CeTe, PrTe, NdTe, PmTe, SmTe, EuTe, GdTe, TbTe, DyTe, HoTe, ErTe, TmTe, YbTe, LuTe, $La_2Te_3$, $Ce_2Te_3$, $Pr_2Te_3$, $Nd_2Te_3$, $Pm_2Te_3$, $Sm_2Te_3$, $Eu_2Te_3$, $Gd_2Te_3$, $Tb_2Te_3$, $Dy_2Te_3$, $Ho_2Te_3$, $Er_2Te_3$, $Tm_2Te_3$, $Yb_2Te_3$, and $Lu_2Te_3$.

The alkali metal complex, the alkaline earth-metal complex, and the rare earth metal complex may include i) one of ions of the alkali metal, the alkaline earth metal, and the rare earth metal and ii), as a ligand bonded to the metal ion, for example, a hydroxyquinoline, a hydroxyisoquinoline, a hydroxybenzoquinoline, a hydroxyacridine, a hydroxyphenanthridine, a hydroxyphenyloxazole, a hydroxyphenylthiazole, a hydroxyphenyloxadiazole, a hydroxyphenylthiadiazole, a hydroxyphenylpyridine, a hydroxyphenylbenzimidazole, a hydroxyphenylbenzothiazole, a bipyridine, a phenanthroline, a cyclopentadiene, or any combination thereof.

The electron injection layer may consist of an alkali metal, an alkaline earth metal, a rare earth metal, an alkali metal-containing compound, an alkaline earth metal-containing compound, a rare earth metal-containing compound, an alkali metal complex, an alkaline earth metal complex, a rare earth metal complex, or any combination thereof, as described above. In one or more embodiments, the electron injection layer may further include an organic material (for example, a compound represented by Formula 601).

In one or more embodiments, the electron injection layer may consist of i) an alkali metal-containing compound (for example, an alkali metal halide), ii) a) an alkali metal-containing compound (for example, an alkali metal halide); and b) an alkali metal, an alkaline earth metal, a rare earth metal, or any combination thereof. In one or more embodiments, the electron injection layer may be a KI:Yb co-deposited layer, an RbI:Yb co-deposited layer, or the like.

When the electron injection layer further includes an organic material, alkali metal, alkaline earth metal, rare earth metal, an alkali metal-containing compound, an alkaline earth metal-containing compound, a rare earth metal-containing compound, alkali metal complex, alkaline earth-metal complex, rare earth metal complex, or any combination thereof may be homogeneously or non-homogeneously dispersed in a matrix including the organic material.

A thickness of the electron injection layer may be in a range of about 1 Å to about 100 Å, and, for example, about 3 Å to about 90 Å. When the thickness of the electron injection layer is within the range described above, the electron injection layer may have satisfactory electron injection characteristics without a substantial increase in driving voltage.

second electrode 150 may be utilized.

The second electrode 150 may be located on the interlayer 130 as described above. The second electrode 150 may be a cathode, which is an electron injection electrode, and as the material for the second electrode 150, a metal, an alloy, an electrically conductive compound, or any combination thereof, each having a low work function, may be used.

In one or more embodiments, the second electrode 150 may include lithium (Li), silver (Ag), magnesium (Mg), aluminum (Al), aluminum-lithium (Al—Li), calcium (Ca), magnesium-indium (Mg—In), magnesium-silver (Mg—Ag), ytterbium (Yb), silver-ytterbium (Ag—Yb), ITO, IZO, or any combination thereof. The second electrode 150 may be a transmissive electrode, a semi-transmissive electrode, or a reflective electrode.

The second electrode 150 may have a single-layered structure or a multi-layered structure including two or more layers.

A capping layer may be used.

A first capping layer may be located outside the first electrode 110, and/or a second capping layer may be located outside the second electrode 150. In detail, the light-emitting device 10 may have a structure in which the first capping layer, the first electrode 110, the interlayer 130, and the second electrode 150 are sequentially stacked in this stated order, a structure in which the first electrode 110, the interlayer 130, the second electrode 150, and the second capping layer are sequentially stacked in this stated order, or a structure in which the first capping layer, the first electrode 110, the interlayer 130, the second electrode 150, and the second capping layer are sequentially stacked in this stated order.

Light generated in an emission layer of the interlayer 130 of the light-emitting device 10 may be extracted toward the outside through the first electrode 110, which is a semi-transmissive electrode or a transmissive electrode, and the first capping layer. In one or more embodiments, light generated in an emission layer of the interlayer 130 of the light-emitting device 10 may be extracted toward the outside through the second electrode 150, which is a semi-transmissive electrode or a transmissive electrode, and the second capping layer.

The first capping layer and the second capping layer may increase external emission efficiency according to the principle of constructive interference. Accordingly, the light extraction efficiency of the light-emitting device 10 is increased, so that the luminescence efficiency of the light-emitting device 10 may be improved.

Each of the first capping layer and second capping layer may include a material having a refractive index (at 589 nm) of 1.6 or more.

The first capping layer and the second capping layer may each independently be an organic capping layer including an organic material, an inorganic capping layer including an inorganic material, or an organic-inorganic composite capping layer including an organic material and an inorganic material.

At least one of the first capping layer and the second capping layer may each independently include carbocyclic compounds, heterocyclic compounds, amine group-containing compounds, porphyrin derivatives, phthalocyanine derivatives, a naphthalocyanine derivatives, alkali metal complexes, alkaline earth metal complexes, or any combination thereof. The carbocyclic compound, the heterocyclic compound, and the amine group-containing compound may be optionally substituted with a substituent including O, N, S, Se, Si, F, Cl, Br, I, or any combination thereof. In one or more embodiments, at least one of the first capping layer and the second capping layer may each independently include an amine group-containing compound.

In one or more embodiments, at least one of the first capping layer and the second capping layer may each independently include a compound represented by Formula 201, a compound represented by Formula 202, or any combination thereof.

In one or more embodiments, at least one of the first capping layer and the second capping layer may each independently include one of Compounds CP1 to CP6, β-NPB, or any combination thereof:

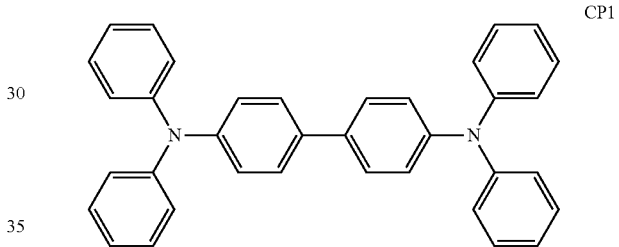

CP1

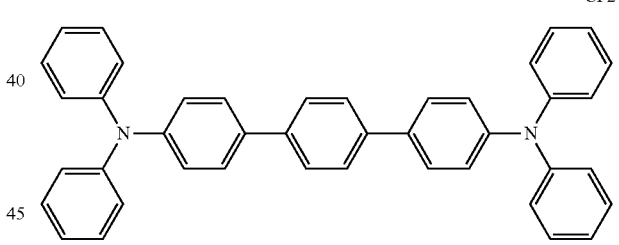

CP2

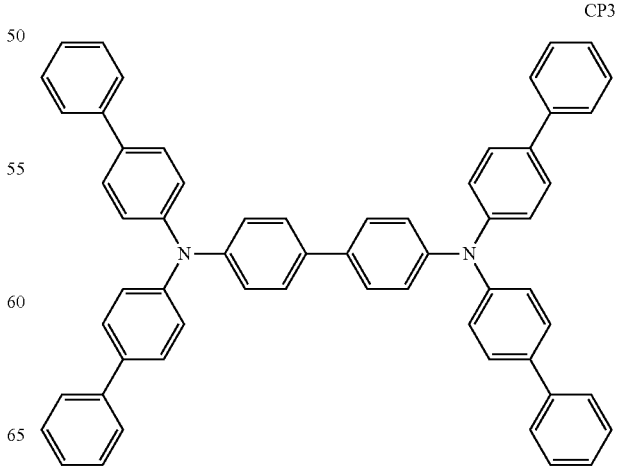

CP3

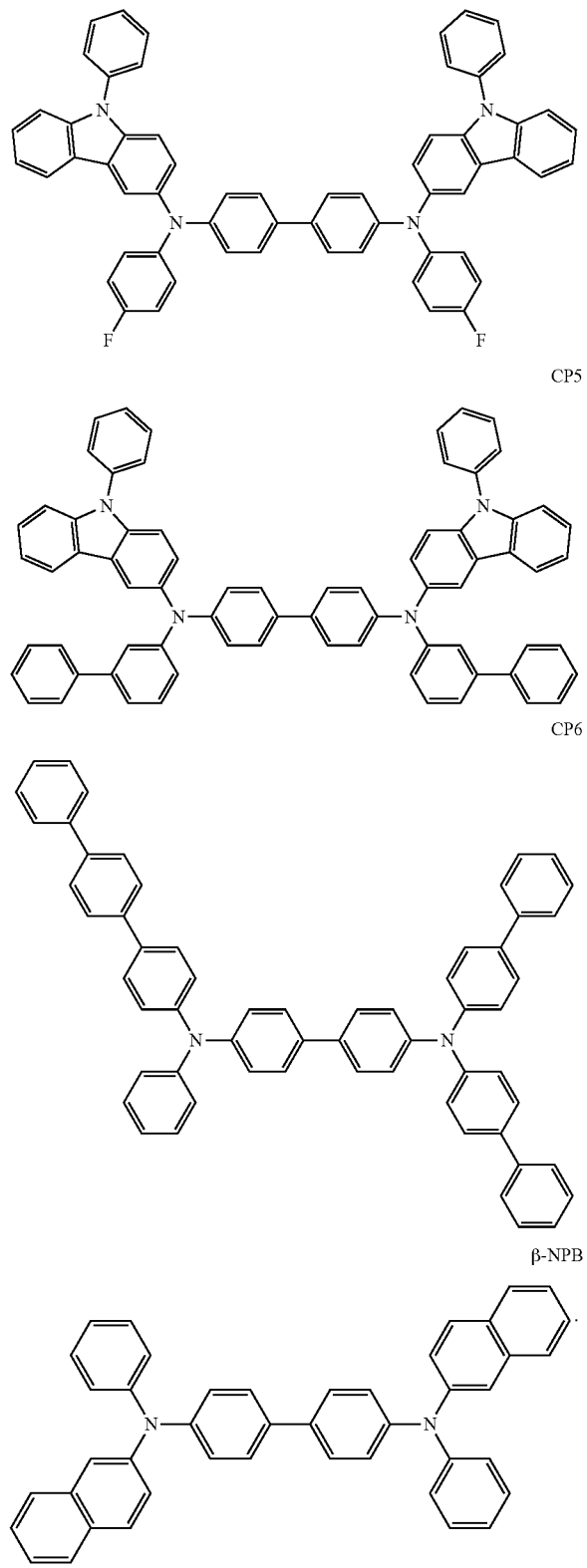

An electronic apparatus is described herein.

The light-emitting device may be included in various electronic apparatuses. In one or more embodiments, the electronic apparatus including the light-emitting device may be a light-emitting apparatus, an authentication apparatus, and the like.

The electronic apparatus (for example, light-emitting apparatus) may further include, in addition to the light-emitting device, i) a color filter, ii) a color conversion layer, or iii) a color filter and a color conversion layer. The color filter and/or the color conversion layer may be located in at least one traveling direction of light emitted from the light-emitting device. For example, the light emitted from the light-emitting device may be blue light. The light-emitting device may be the same as described above. In one or more embodiments, the color conversion layer may include quantum dots. The quantum dot may be, for example, a quantum dot as described herein.

The electronic apparatus may include a first substrate. The first substrate may include a plurality of subpixel areas, the color filter may include a plurality of color filter areas respectively corresponding to the subpixel areas, and the color conversion layer may include a plurality of color conversion areas respectively corresponding to the subpixel areas.

A pixel-defining film may be located among the subpixel areas to define each of the subpixel areas.

The color filter may further include a plurality of color filter areas and light-shielding patterns located among the color filter areas, and the color conversion layer may include a plurality of color conversion areas and light-shielding patterns located among the color conversion areas.

The color filter areas (or the color conversion areas) may include a first area emitting first color light, a second area emitting second color light, and/or a third area emitting third color light, and the first color light, the second color light, and/or the third color light may have different maximum emission wavelengths from one another. In one or more embodiments, the first color light may be red light, the second color light may be green light, and the third color light may be blue light. In one or more embodiments, the color filter areas (or the color conversion areas) may include quantum dots. In detail, the first area may include a red quantum dot, the second area may include a green quantum dot, and the third area may not include a quantum dot. The quantum dot is the same as described in the present specification. The first area, the second area, and/or the third area may each include a scatterer.

In one or more embodiments, the light-emitting device may emit first light, the first area may absorb the first light to emit first first-color light, the second area may absorb the first light to emit second first-color light, and the third area may absorb the first light to emit third first-color light. In this regard, the first first-color light, the second first-color light, and the third first-color light may have different maximum emission wavelengths. In detail, the first light may be blue light, the first first-color light may be red light, the second first-color light may be green light, and the third first-color light may be blue light.

The electronic apparatus may further include a thin-film transistor in addition to the light-emitting device as described above. The thin-film transistor may include a source electrode, a drain electrode, and an activation layer, wherein any one of the source electrode and the drain electrode may be electrically connected to any one of the first electrode and the second electrode of the light-emitting device.

The thin-film transistor may further include a gate electrode, a gate insulating film, and the like.

The activation layer may include crystalline silicon, amorphous silicon, organic semiconductor, oxide semiconductor, and the like.

The electronic apparatus may further include a sealing portion configured to seal the light-emitting device. The sealing portion and/or the color conversion layer may be placed between the color filter and the light-emitting device. The sealing portion allows light from the light-emitting device to be extracted to the outside, while simultaneously preventing ambient air and moisture from penetrating into the light-emitting device. The sealing portion may be a sealing substrate including a transparent glass substrate or a plastic substrate. The sealing portion may be a thin-film encapsulation layer including at least one layer of an organic layer and/or an inorganic layer. When the sealing portion is a thin film encapsulation layer, the electronic apparatus may be flexible.

Various functional layers may be additionally located on the sealing portion, in addition to the color filter and/or the color conversion layer, according to the use of the electronic apparatus. The functional layers may include a touch screen layer, a polarizing layer, and the like. The touch screen layer may be a pressure-sensitive touch screen layer, a capacitive touch screen layer, or an infrared touch screen layer. The authentication apparatus may be, for example, a biometric authentication apparatus that authenticates an individual by using biometric information of a living body (for example, fingertips, pupils, etc.).

The authentication apparatus may further include, in addition to the light-emitting device, a biometric information collector.

The electronic apparatus may be applied to various displays, light sources, lighting, personal computers (for example, a mobile personal computer), mobile phones, digital cameras, electronic organizers, electronic dictionaries, electronic game machines, medical instruments (for example, electronic thermometers, sphygmomanometers, blood glucose meters, pulse measurement devices, pulse wave measurement devices, electrocardiogram displays, ultrasonic diagnostic devices, or endoscope displays), fish finders, various measuring instruments, meters (for example, meters for a vehicle, an aircraft, and a vessel), projectors, and the like.

Terms used herein may be described as follows.

The term "$C_3$-$C_{60}$ carbocyclic group" as used herein refers to a cyclic group consisting of carbon only as a ring-forming atom and having three to sixty carbon atoms, and the term "$C_1$-$C_{60}$ heterocyclic group" as used herein refers to a cyclic group that has one to sixty carbon atoms and further has, in addition to carbon, a heteroatom as a ring-forming atom. The $C_3$-$C_{60}$ carbocyclic group and the $C_1$-$C_{60}$ heterocyclic group may each be a monocyclic group consisting of one ring or a polycyclic group in which two or more rings are condensed with each other. For example, the $C_1$-$C_{60}$ heterocyclic group has 3 to 61 ring-forming atoms.

The "cyclic group" as used herein may include the $C_3$-$C_{60}$ carbocyclic group and the $C_1$-$C_{60}$ heterocyclic group.

The term "π electron-rich $C_3$-$C_{60}$ cyclic group" as used herein refers to a cyclic group that has three to sixty carbon atoms and does not include *—N=*' as a ring-forming moiety, and the term "π electron-deficient nitrogen-containing $C_1$-$C_{60}$ cyclic group" as used herein refers to a heterocyclic group that has one to sixty carbon atoms and includes *—N=*' as a ring-forming moiety.

For example, the $C_3$-$C_{60}$ carbocyclic group may be i) a T1 group or ii) a condensed cyclic group in which at least two T1 groups are condensed with each other (for example, a cyclopentadiene group, an adamantane group, a norbornane group, a benzene group, a pentalene group, a naphthalene group, an azulene group, an indacene group, an acenaphthylene group, a phenalene group, a phenanthrene group, an anthracene group, a fluoranthene group, a triphenylene group, a pyrene group, a chrysene group, a perylene group, a pentaphene group, a heptalene group, a naphthacene group, a picene group, a hexacene group, a pentacene group, a rubicene group, a coronene group, an ovalene group, an indene group, a fluorene group, a spiro-bifluorene group, a benzofluorene group, an indenophenanthrene group, or an indenoanthracene group), the $C_1$-$C_{60}$ heterocyclic group may be i) a T2 group, ii) a condensed cyclic group in which at least two T2 groups are condensed with each other, or iii) a condensed cyclic group in which at least one T2 group and at least one T1 group are condensed with each other (for example, a pyrrole group, a thiophene group, a furan group, an indole group, a benzoindole group, a naphthoindole group, an isoindole group, a benzoisoindole group, a naphthoisoindole group, a benzosilole group, a benzothiophene group, a benzofuran group, a carbazole group, a dibenzosilole group, a dibenzothiophene group, a dibenzofuran group, an indenocarbazole group, an indolocarbazole group, a benzofurocarbazole group, a benzothienocarbazole group, a benzosilolocarbazole group, a benzoindolocarbazole group, a benzocarbazole group, a benzonaphthofuran group, a benzonaphthothiophene group, a benzonaphthosilole group, a benzofurodibenzofuran group, a benzofurodibenzothiophene group, a benzothienodibenzothiophene group, a pyrazole group, an imidazole group, a triazole group, an oxazole group, an isoxazole group, an oxadiazole group, a thiazole group, an isothiazole group, a thiadiazole group, a benzopyrazole group, a benzimidazole group, a benzoxazole group, a benzoisoxazole group, a benzothiazole group, a benzoisothiazole group, a pyridine group, a pyrimidine group, a pyrazine group, a pyridazine group, a triazine group, a quinoline group, an isoquinoline group, a benzoquinoline group, a benzoisoquinoline group, a quinoxaline group, a benzoquinoxaline group, a quinazoline group, a benzoquinazoline group, a phenanthroline group, a cinnoline group, a phthalazine group, a naphthyridine group, an imidazopyridine group, an imidazopyrimidine group, an imidazotriazine group, an imidazopyrazine group, an imidazopyridazine group, an azacarbazole group, an azafluorene group, an azadibenzosilole group, an azadibenzothiophene group, an azadibenzofuran group, etc.), the π electron-rich $C_3$-$C_{60}$ cyclic group may be i) a T1 group, ii) a condensed cyclic group in which at least two T1 groups are condensed with each other, iii) a T3 group, iv) a condensed cyclic group in which at least two T3 groups are condensed with each other, or v) a condensed cyclic group in which at least one T3 group and at least one T1 group are condensed with each other (for example, the $C_3$-$C_{60}$ carbocyclic group, a 1H-pyrrole group, a silole group, a borole group, a 2H-pyrrole group, a 3H-pyrrole group, a thiophene group, a furan group, an indole group, a benzoindole group, a naphthoindole group, an isoindole group, a benzoisoindole group, a naphthoisoindole group, a benzosilole group, a benzothiophene group, a benzofuran group, a carbazole group, a dibenzosilole group, a dibenzothiophene group, a dibenzofuran group, an indenocarbazole group, an indolocarbazole group, a benzofurocarbazole group, a benzothienocarbazole group, a benzosilolocarbazole group, a benzoindolocarbazole group, a benzocarbazole group, a benzonaphthofuran group, a benzonaphthothiophene group, a benzonaphthosilole group, a benzofurodibenzofuran group, a benzofurodibenzothiophene group, a benzothienodibenzothiophene group, etc.), the π electron-deficient nitrogen-containing $C_1$-$C_{60}$ cyclic group may be i) a T4 group, ii) a condensed cyclic group in which at least two T4 groups are condensed with each other, iii) a condensed cyclic group in which at least one T4 group and at least one T1 group are condensed with each other, iv) a condensed cyclic group in which at least one T4 group and at least one T3 group are condensed with each other, or v) a condensed cyclic group in which at least one T4 group, at least one T1 group, and at least one T3 group are condensed with one another (for example, a pyrazole group, an imidazole group, a triazole group, an oxazole group, an isoxazole group, an oxadiazole group, a thiazole group, an isothiazole group, a thiadiazole group, a benzopyrazole group, a benzimidazole group, a benzoxazole group, a benzoisoxazole group, a benzothiazole group, a benzoisothiazole group, a pyridine group, a pyrimidine group, a pyrazine group, a pyridazine group, a triazine group, a quinoline group, an isoquinoline group, a benzoquinoline group, a benzoisoquinoline group, a quinoxaline group, a benzoquinoxaline group, a quinazoline group, a benzoquinazoline group, a phenanthroline group, a cinnoline group, a phthalazine group, a naphthyridine group, an imidazopyridine group, an imidazopyrimidine group, an imidazotriazine group, an imidazopyrazine group, an imidazopyridazine group, an azacarbazole group, an azafluorene group, an azadibenzosilole group, an azadibenzothiophene group, an azadibenzofuran group, etc.), the T1 group may be a cyclopropane group, a cyclobutane group, a cyclopentane group, a cyclohexane group, a cycloheptane group, a cyclooctane group, a cyclobutene group, a cyclopentene group, a cyclopentadiene group, a cyclohexene group, a cyclohexadiene group, a cycloheptene group, an adamantane group, a norbornane (or a bicyclo[2.2.1]heptane) group, a norbornene group, a bicyclo[1.1.1]pentane group, a bicyclo[2.1.1]hexane group, a bicyclo[2.2.2]octane group, or a benzene group, the T2 group may be a furan group, a thiophene group, a 1H-pyrrole group, a silole group, a borole group, a 2H-pyrrole group, a 3H-pyrrole group, an imidazole group, a pyrazole group, a triazole group, a tetrazole group, an oxazole group, an isoxazole group, an oxadiazole group, a thiazole group, an isothiazole group, a thiadiazole group, an azasilole group, an azaborole group, a pyridine group, a pyrimidine group, a pyrazine group, a pyridazine group, a triazine group, a tetrazine group, a pyrrolidine group, an imidazolidine group, a dihydropyrrole group, a piperidine group, a tetrahydropyridine group, a dihydropyridine group, a hexahydropyrimidine group, a tetrahydropyrimidine group, a dihydropyrimidine group, a piperazine group, a tetrahydropyrazine group, a dihydropyrazine group, a tetrahydropyridazine group, or a dihydropyridazine group, the T3 group may be a furan group, a thiophene group, a 1H-pyrrole group, a silole group, or a borole group, and the T4 group may be a 2H-pyrrole group, a 3H-pyrrole group, an imidazole group, a pyrazole group, a triazole group, a tetrazole group, an oxazole group, an isoxazole group, an oxadiazole group, a thiazole group, an isothiazole group, a thiadiazole group, an azasilole group, an azaborole group, a pyridine group, a pyrimidine group, a pyrazine group, a pyridazine group, a triazine group, or a tetrazine group.

The terms "the cyclic group, the $C_3$-$C_{60}$ carbocyclic group, the $C_1$-$C_{60}$ heterocyclic group, the π electron-rich $C_3$-$C_{60}$ cyclic group, or the π electron-deficient nitrogen-containing $C_1$-$C_{60}$ cyclic group" as used herein refer to a group condensed with any cyclic group, a monovalent group, or a polyvalent group (for example, a divalent group, a trivalent group, a tetravalent group, etc.), depending on the structure of a formula in connection with which the terms are used. In one or more embodiments, "a benzene group" may be a benzo group, a phenyl group, a phenylene group, or the like, which may be easily understood by one of ordinary skill in the art according to the structure of a formula including the "benzene group."

Examples of the monovalent $C_3$-$C_{60}$ carbocyclic group and the monovalent $C_1$-$C_{60}$ heterocyclic group are a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_1$-$C_{60}$ heteroaryl group, a monovalent non-aromatic condensed polycyclic group, and a monovalent non-aromatic condensed heteropolycyclic group, and examples of the divalent $C_3$-$C_{60}$ carbocyclic group and the monovalent $C_1$-$C_{60}$ heterocyclic group are a $C_3$-$C_{10}$ cycloalkylene group, a $C_1$-$C_{10}$ heterocycloalkylene group, a $C_3$-$C_{10}$ cycloalkenylene group, a $C_1$-$C_{10}$ heterocycloalkenylene group, a $C_6$-$C_{60}$ arylene group, a $C_1$-$C_{60}$ heteroarylene group, a divalent non-aromatic condensed polycyclic group, and a substituted or unsubstituted divalent non-aromatic condensed heteropolycyclic group.

The term "$C_1$-$C_{60}$ alkyl group" as used herein refers to a linear or branched aliphatic hydrocarbon monovalent group that has one to sixty carbon atoms, and examples thereof are a methyl group, an ethyl group, an n-propyl group, an isopropyl group, an n-butyl group, a sec-butyl group, an isobutyl group, a tert-butyl group, an n-pentyl group, a tert-pentyl group, a neopentyl group, an isopentyl group, a sec-pentyl group, a 3-pentyl group, a sec-isopentyl group, an n-hexyl group, an isohexyl group, a sec-hexyl group, a tert-hexyl group, an n-heptyl group, an isoheptyl group, a sec-heptyl group, a tert-heptyl group, an n-octyl group, an isooctyl group, a sec-octyl group, a tert-octyl group, an n-nonyl group, an iso-nonyl group, a sec-nonyl group, a tert-nonyl group, an n-decyl group, an isodecyl group, a sec-decyl group, and a tert-decyl group. The term "$C_1$-$C_{60}$ alkylene group" as used herein refers to a divalent group having the same structure as the $C_1$-$C_{60}$ alkyl group.

The term "$C_2$-$C_{60}$ alkenyl group" as used herein refers to a monovalent hydrocarbon group having at least one carbon-carbon double bond in the middle or at the terminus of the $C_2$-$C_{60}$ alkyl group, and examples thereof are an ethenyl group, a propenyl group, and a butenyl group. The term "$C_2$-$C_{60}$ alkenylene group" as used herein refers to a divalent group having the same structure as the $C_2$-$C_{60}$ alkenyl group.

The term "$C_2$-$C_{60}$ alkynyl group" as used herein refers to a monovalent hydrocarbon group having at least one carbon-carbon triple bond in the middle or at the terminus of the $C_2$-$C_{60}$ alkyl group, and examples thereof include an ethynyl group and a propynyl group. The term "$C_2$-$C_{60}$ alkynylene group" as used herein refers to a divalent group having the same structure as the $C_2$-$C_{60}$ alkynyl group.

The term "$C_1$-$C_{60}$ alkoxy group" as used herein refers to a monovalent group represented by —$OA_{101}$ (wherein $A_{101}$ is the $C_1$-$C_{60}$ alkyl group), and examples thereof include a methoxy group, an ethoxy group, and an isopropyloxy group.

The term "$C_3$-$C_{10}$ cycloalkyl group" as used herein refers to a monovalent saturated hydrocarbon cyclic group having three to ten carbon atoms, and examples thereof are a cyclopropyl group, a cyclobutyl group, a cyclopentyl group, a cyclohexyl group, a cycloheptyl group, a cyclooctyl group, an adamantanyl group, a norbornanyl group (or bicyclo[2.2.1]heptyl group), a bicyclo[1.1.1]pentyl group, a bicyclo[2.1.1]hexyl group, and a bicyclo[2.2.2]octyl group. The term "$C_3$-$C_{10}$ cycloalkylene group" as used herein refers to a divalent group having the same structure as the $C_3$-$C_{10}$ cycloalkyl group.

The term "$C_1$-$C_{10}$ heterocycloalkyl group" as used herein refers to a monovalent cyclic group that further includes, in addition to a carbon atom, at least one heteroatom as a ring-forming atom and has one to ten carbon atoms, and examples thereof are a 1,2,3,4-oxatriazolidinyl group, a tetrahydrofuranyl group, and a tetrahydrothiophenyl group. The term "$C_1$-$C_{10}$ heterocycloalkylene group" as used herein refers to a divalent group having the same structure as the $C_1$-$C_{10}$ heterocycloalkyl group.

The term $C_3$-$C_{10}$ cycloalkenyl group used herein refers to a monovalent cyclic group that has three to ten carbon atoms and at least one carbon-carbon double bond in the ring thereof and no aromaticity, and examples thereof are a cyclopentenyl group, a cyclohexenyl group, and a cycloheptenyl group. The term "$C_3$-$C_{10}$ cycloalkenylene group" as used herein refers to a divalent group having the same structure as the $C_3$-$C_{10}$ cycloalkenyl group.

The term "$C_1$-$C_{10}$ heterocycloalkenyl group" as used herein refers to a monovalent cyclic group that has, in addition to a carbon atom, at least one heteroatom as a ring-forming atom, one to ten carbon atoms, and at least one carbon-carbon double bond in the cyclic structure thereof. Examples of the $C_1$-$C_{10}$ heterocycloalkenyl group include a 4,5-dihydro-1,2,3,4-oxatriazolyl group, a 2,3-dihydrofuranyl group, and a 2,3-dihydrothiophenyl group. The term "$C_1$-$C_{10}$ heterocycloalkenylene group" as used herein refers to a divalent group having the same structure as the $C_1$-$C_{10}$ heterocycloalkenyl group.

The term "$C_6$-$C_{60}$ aryl group" as used herein refers to a monovalent group having a carbocyclic aromatic system having six to sixty carbon atoms, and the term "$C_6$-$C_{60}$ arylene group" as used herein refers to a divalent group having a carbocyclic aromatic system having six to sixty carbon atoms. Examples of the $C_6$-$C_{60}$ aryl group are a phenyl group, a pentalenyl group, a naphthyl group, an azulenyl group, an indacenyl group, an acenaphthyl group, a phenalenyl group, a phenanthrenyl group, an anthracenyl group, a fluoranthenyl group, a triphenylenyl group, a pyrenyl group, a chrysenyl group, a perylenyl group, a pentaphenyl group, a heptalenyl group, a naphthacenyl group, a picenyl group, a hexacenyl group, a pentacenyl group, a rubicenyl group, a coronenyl group, and an ovalenyl group. When the $C_6$-$C_{60}$ aryl group and the $C_6$-$C_{60}$ arylene group each include two or more rings, the rings may be condensed with each other.

The term "$C_1$-$C_{60}$ heteroaryl group" as used herein refers to a monovalent group having a heterocyclic aromatic system that has, in addition to a carbon atom, at least one heteroatom as a ring-forming atom, and 1 to 60 carbon atoms. The term "$C_1$-$C_{60}$ heteroarylene group" as used herein refers to a divalent group having a heterocyclic aromatic system that has, in addition to a carbon atom, at least one heteroatom as a ring-forming atom, and one to sixty carbon atoms. Examples of the $C_1$-$C_{60}$ heteroaryl group are a pyridinyl group, a pyrimidinyl group, a pyrazinyl group, a pyridazinyl group, a triazinyl group, a quinolinyl group, a benzoquinolinyl group, an isoquinolinyl group, a benzoisoquinolinyl group, a quinoxalinyl group, a benzoquinoxalinyl group, a quinazolinyl group, a benzoquinazolinyl group, a cinnolinyl group, a phenanthrolinyl group, a phthalazinyl group, and a naphthyridinyl group. When the $C_1$-$C_{60}$ heteroaryl group and the $C_1$-$C_{60}$ heteroarylene group each include two or more rings, the rings may be condensed with each other.

The term "monovalent non-aromatic condensed polycyclic group" as used herein refers to a monovalent group (for example, having eight to sixty carbon atoms) having two or more rings condensed with each other, only carbon atoms as ring-forming atoms, and no aromaticity in its entire molecular structure. Examples of the monovalent non-aromatic condensed polycyclic group are an indenyl group, a fluorenyl group, a spiro-bifluorenyl group, a benzofluorenyl group, an indenophenanthrenyl group, and an indenoanthracenyl group. The term "divalent non-aromatic condensed polycyclic group" as used herein refers to a divalent group having the same structure as a monovalent non-aromatic condensed polycyclic group.

The term "monovalent non-aromatic condensed heteropolycyclic group" as used herein refers to a monovalent group (for example, having one to sixty carbon atoms) having two or more rings condensed with each other, at least one heteroatom other than carbon atoms, as a ring-forming atom, and no aromaticity in its entire molecular structure. Examples of the monovalent non-aromatic condensed heteropolycyclic group are a pyrrolyl group, a thiophenyl group, a furanyl group, an indolyl group, a benzoindolyl group, a naphthoindolyl group, an isoindolyl group, a benzoisoindolyl group, a naphthoisoindolyl group, a benzosilolyl group, a benzothiophenyl group, a benzofuranyl group, a carbazolyl group, a dibenzosilolyl group, a dibenzothiophenyl group, a dibenzofuranyl group, an azacarbazolyl group, an azafluorenyl group, an azadibenzosilolyl group, an azadibenzothiophenyl group, an azadibenzofuranyl group, a pyrazolyl group, an imidazolyl group, a triazolyl group, a tetrazolyl group, an oxazolyl group, an isoxazolyl group, a thiazolyl group, an isothiazolyl group, an oxadiazolyl group, a thiadiazolyl group, a benzopyrazolyl group, a benzimidazolyl group, a benzoxazolyl group, a benzothiazolyl group, a benzoxadiazolyl group, a benzothiadiazolyl group, an imidazopyridinyl group, an imidazopyrimidinyl group, an imidazotriazinyl group, an imidazopyrazinyl group, an imidazopyridazinyl group, an indeno carbazolyl group, an indolocarbazolyl group, a benzofurocarbazolyl group, a benzothienocarbazolyl group, a benzosilolocarbazolyl group, a benzoindolocarbazolyl group, a benzocarbazolyl group, a benzonaphthofuranyl group, a benzonaphthothiophenyl group, a benzonaphtho silolyl group, a benzofurodibenzofuranyl group, a benzofurodibenzothiophenyl group, and a benzothienodibenzothiophenyl group. The term "divalent non-aromatic condensed heteropolycyclic group" as used herein refers to a divalent group having the same structure as a monovalent non-aromatic condensed heteropolycyclic group.

The term "$C_6$-$C_{60}$ aryloxy group" as used herein indicates —$OA_{102}$ (wherein $A_{102}$ is the $C_6$-$C_{60}$ aryl group), and the term "$C_6$-$C_{60}$ arylthio group" as used herein indicates —$SA_{103}$ (wherein $A_{103}$ is the $C_6$-$C_{60}$ aryl group).

The term "$C_7$-$C_{60}$ aryl alkyl group" used herein refers to -$A_{104}A_{105}$ (where $A_{104}$ may be a $C_1$-$C_{54}$ alkylene group, and $A_{105}$ may be a $C_6$-$C_{59}$ aryl group), and the term "$C_2$-$C_{60}$ heteroaryl alkyl group" used herein refers to -$A_{106}A_{107}$ (where $A_{106}$ may be a $C_1$-$C_{59}$ alkylene group, and $A_{107}$ may be a $C_1$-$C_{59}$ heteroaryl group).

The term "$R_{10a}$" as used herein refers to:
deuterium (-D), —F, —Cl, —Br, —I, a hydroxyl group, a cyano group, or a nitro group,
a $C_1$-$C_{60}$ alkyl group, a $C_2$-$C_{60}$ alkenyl group, a $C_2$-$C_{60}$ alkynyl group, or a $C_1$-$C_{60}$ alkoxy group, each unsubstituted or substituted with deuterium, —F, —Cl, —Br, —I, a hydroxyl group, a cyano group, a nitro group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_7$-$C_{60}$ aryl alkyl group, a $C_2$-$C_{60}$ heteroaryl alkyl group, —$Si(Q_{11})(Q_{12})(Q_{13})$, —$N(Q_{11})(Q_{12})$, —$B(Q_{11})(Q_{12})$, —$C(\!=\!O)(Q_{11})$, —$S(\!=\!O)_2(Q_{11})$, —$P(\!=\!O)(Q_{11})(Q_{12})$, or any combination thereof;
a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_7$-$C_{60}$ aryl alkyl group, or a $C_2$-$C_{60}$ heteroaryl alkyl group, each unsubstituted or substituted with deuterium, —F, —Cl, —Br, —I, a hydroxyl group, a cyano group, a nitro group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_7$-$C_{60}$ aryl alkyl group, a $C_2$-$C_{60}$ heteroaryl alkyl group, —$Si(Q_{21})(Q_{22})(Q_{23})$, —$N(Q_{21})(Q_{22})$, —$B(Q_{21})(Q_{22})$, —$C(\!=\!O)(Q_{21})$, —$S(\!=\!O)_2(Q_{21})$, —$P(\!=\!O)(Q_{21})(Q_{22})$, or any combination thereof; or —$Si(Q_{31})(Q_{32})(Q_{33})$, —$N(Q_{31})(Q_{32})$, —$B(Q_{31})(Q_{32})$, —$C(\!=\!O)(Q_{31})$, —$S(\!=\!O)_2(Q_{31})$, or —$P(\!=\!O)(Q_{31})(Q_{32})$.

$Q_1$ to $Q_3$, $Q_{11}$ to $Q_{13}$, $Q_{21}$ to $Q_{23}$, and $Q_{31}$ to $Q_{33}$ used herein may each independently be: hydrogen; deuterium; —F; —Cl; —Br; —I; a hydroxyl group; a cyano group; a nitro group; a $C_1$-$C_{60}$ alkyl group; a $C_2$-$C_{60}$ alkenyl group; a $C_2$-$C_{60}$ alkynyl group; a $C_1$-$C_{60}$ alkoxy group; a $C_3$-$C_{60}$ carbocyclic group or a $C_1$-$C_{60}$ heterocyclic group, each unsubstituted or substituted with deuterium, —F, a cyano group, a $C_1$-$C_{60}$ alkyl group, a $C_1$-$C_{60}$ alkoxy group, a phenyl group, a biphenyl group, or any combination thereof; a $C_7$-$C_{60}$ arylalkyl group; or a $C_2$-$C_{60}$ heteroarylalkyl group.

The term "heteroatom" as used herein refers to any atom other than a carbon atom. Examples of the heteroatom are O, S, N, P, Si, B, Ge, Se, and any combination thereof.

The term "the third-row transition metal" used herein includes hafnium (Hf), tantalum (Ta), tungsten (W), rhenium (Re), osmium (Os), iridium (Ir), platinum (Pt), gold (Au), etc.

The term "Ph" as used herein refers to a phenyl group, the term "Me" as used herein refers to a methyl group, the term "Et" as used herein refers to an ethyl group, the term "ter-Bu" or "Bu$^t$" as used herein refers to a tert-butyl group, and the term "OMe" as used herein refers to a methoxy group.

The term "biphenyl group" as used herein refers to "a phenyl group substituted with a phenyl group." In other words, the "biphenyl group" is a substituted phenyl group having a $C_6$-$C_{60}$ aryl group as a substituent.

The term "terphenyl group" as used herein refers to "a phenyl group substituted with a biphenyl group". In other words, the "terphenyl group" is a substituted phenyl group having, as a substituent, a $C_6$-$C_{60}$ aryl group substituted with a $C_6$-$C_{60}$ aryl group.

The maximum number of carbon atoms in this substituent definition section is an example only. In an embodiment, the maximum carbon number of 60 in the $C_1$-$C_{60}$ alkyl group is an example, and the definition of the alkyl group is equally applied to a $C_1$-$C_{20}$ alkyl group. The same applies to other cases.

* and *' as used herein, unless defined otherwise, each refer to a binding site to a neighboring atom in a corresponding formula.

Hereinafter, a compound and light-emitting device according to embodiments will be described in detail with reference to Examples.

An example is provided.

Preparation of First Solution of First Perovskite Compound Precursor 1 mol of CuI was dissolved in 1 L of DMF to manufacture 1 M of a first solution.

Preparation of Second Solution of Second Perovskite Compound Precursor 1 mol of CsI was dissolved in 1 L of DMF to manufacture 1 M of a second solution.

Manufacture of Light-Emitting Device (Form Hole Injection Layer as Perovskite Thin Film)

Features of Comparative Example 1 are discussed.

As an anode, a glass substrate with 15 Ωcm$^2$ (1,200 Å) ITO thereon, which was manufactured by Corning Inc., was cut to a size of 1 m×1 m×0.7 mm, and the glass substrate was sonicated by using isopropyl alcohol and pure water for 5 minutes each, and then ultraviolet (UV) light was irradiated for 30 minutes thereto and ozone was exposed thereto for cleaning. Then, the resultant glass substrate was loaded onto a vacuum deposition apparatus.

$Cs_3Cu_2I_5$ solution (1 M in DMF) was spray coated on the substrate to form a hole injection layer having a thickness of 200 Å. Subsequently, HT 1 was vacuum-deposited thereon to form a hole transport layer having a thickness of 200 Å.

On the hole transport layer, Compound 100 as a host and fluorescent dopant Compound 200 as a dopant were co-deposited to a weight ratio of 97:3 to form an emission layer having a thickness of 100 Å.

T2T was vacuum-deposited on the emission layer to form a hole blocking layer having a thickness of 100 Å.

TPM-TAZ and Liq were deposited on the hole blocking layer to a weight ratio of 5:5 to form an electron transport layer having a thickness of 300 Å.

Yb was vacuum-deposited on the electron transport layer to form a layer having a thickness of 10 Å, AgMg was vacuum-deposited thereon to form a cathode having a thickness of 100 Å, and CPL was deposited thereon to form a capping layer having a thickness of 700 Å, thereby manufacturing a light-emitting device.

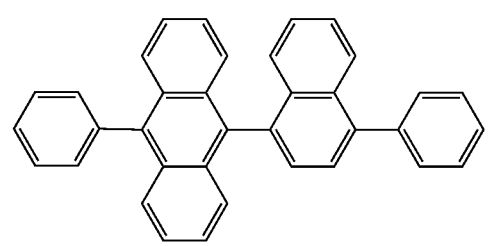

-continued

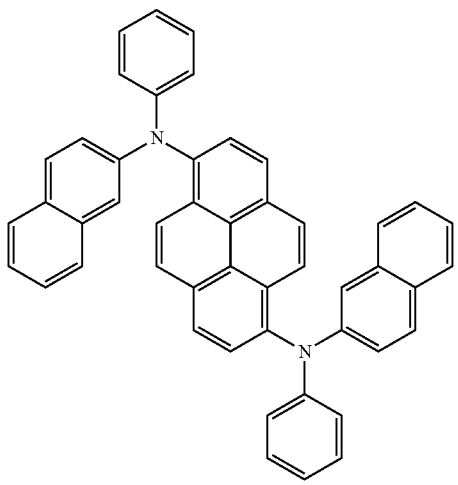

T2T

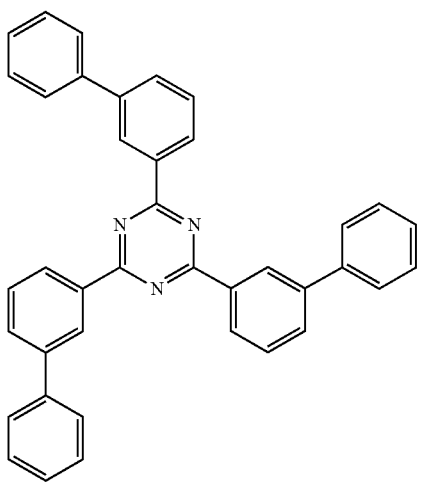

TPM-TAZ

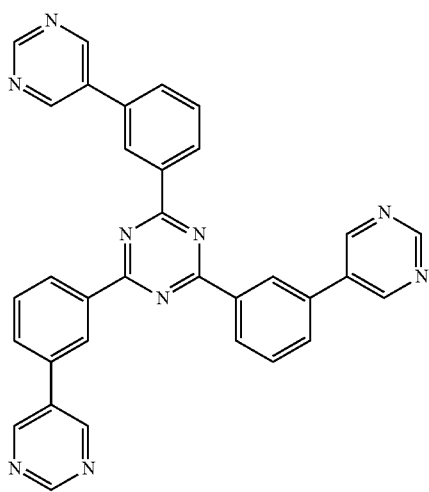

-continued

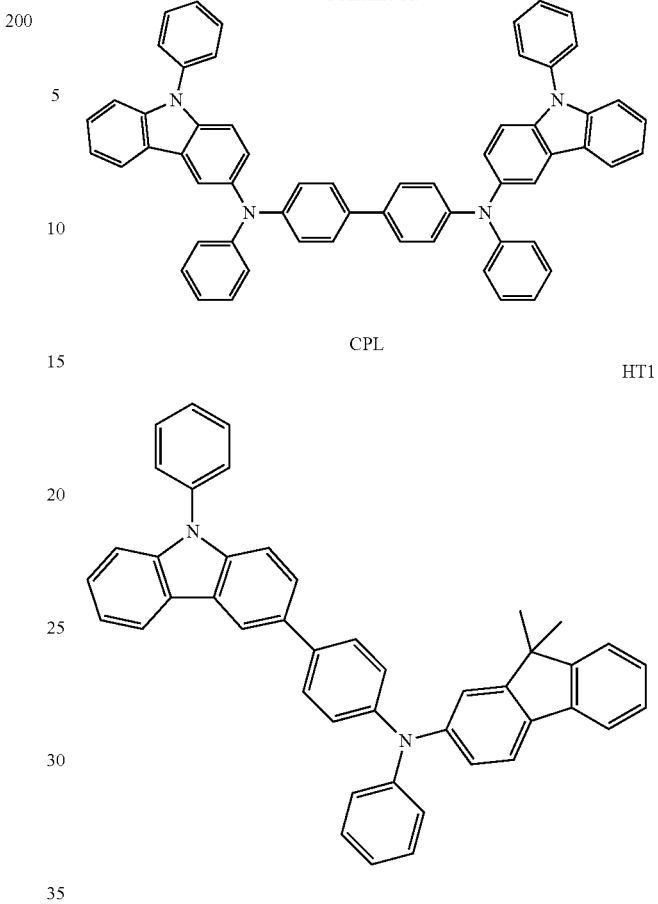

CPL

HT1

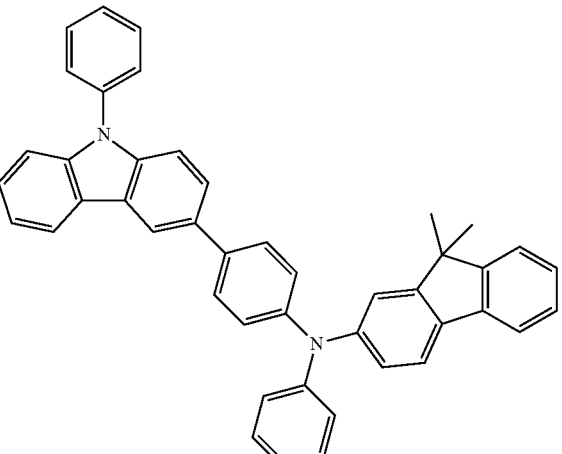

Example 1 may be further discussed.

Figure 2:
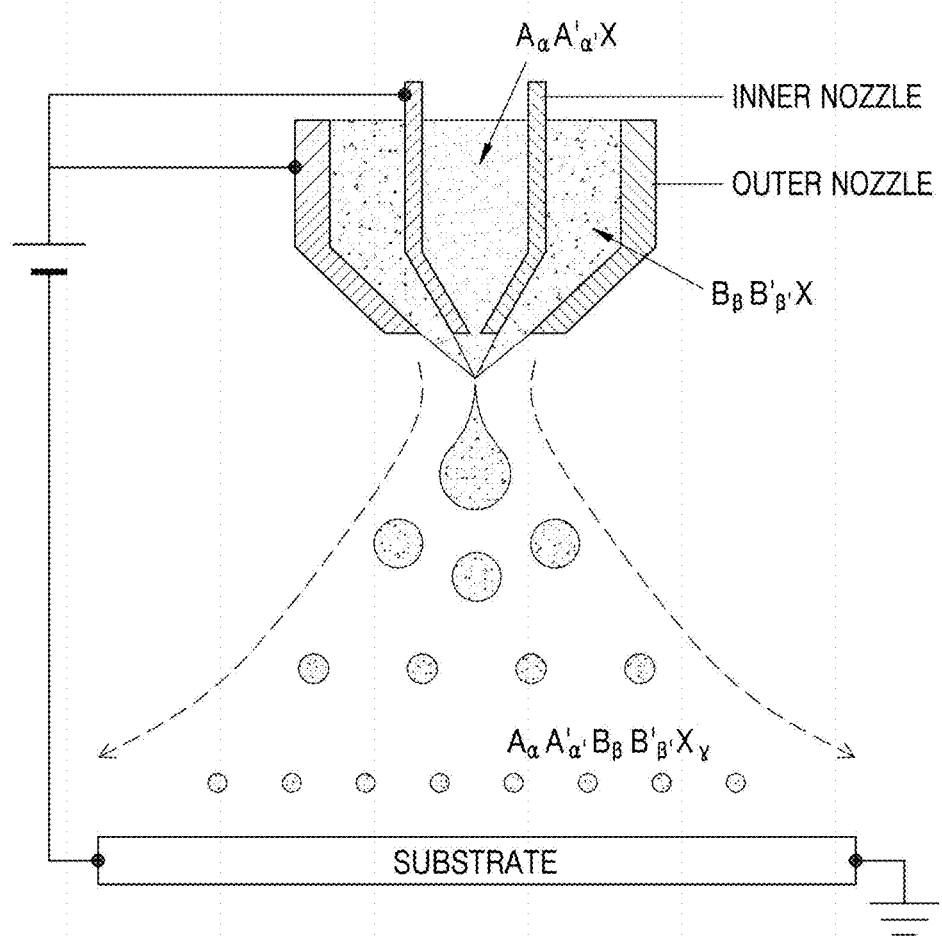
FIG. 2 is a schematic view illustrating a method of forming a perovskite thin film according to an embodiment of the present disclosure.

The dual nozzle was set as in FIG. 2, the anode and the dual nozzle were electrically connected, and a voltage of 45 keV was applied thereto. The temperature of the substrate was 150° C.

In case the inner nozzle inlet and the outer nozzle inlet were cut, the cross-section becomes a doughnut shape. Here, the inlet diameter of the inner nozzle, which is the inner diameter of the doughnut, was 400 μm. The distance between the inner nozzle inlet and the outer nozzle inlet, which is the thickness of the doughnut, is 600 μm.

The distance between the dual nozzle and the anode was 20 cm.

The pressure of the inner nozzle was 10 psi, and the pressure of the outer nozzle was 20 psi.

The temperature of the inner nozzle and the outer nozzle were set to room temperature.

The first solution [CuI] was set to be sprayed with the inner nozzle of the dual nozzle which includes the inner nozzle and the outer nozzle, and the second solution [CSI] was set to be sprayed with the outer nozzle.

The first solution [CuI] was sprayed with the inner nozzle for about 30 seconds on the anode, and at the same time, the second solution [CSI] was sprayed with the outer nozzle.

Then, the solution was left for one minute to evaporate all solvent, to thereby form a hole injection layer having a thickness of 100 Å.

Then, the light-emitting device was manufactured in the same manner as in Comparative Example 1.

To evaluate luminescence characteristics of the light-emitting devices manufactured according to Comparative Example 1 and Example 1, the voltage at the current density of 10 mA/cm², efficiency, and lifespan thereof were measured.

The efficiency, etc. were measured using measurement device C9920-2-12 of Hamamatsu Photonics Inc.

The results are illustrated in Table 1 below.

TABLE 1

| | Driving voltage (V) @10 mA | Efficiency (Cd/A) | Color coordinates (B y) | Lifespan@400 nit (~97%) | ΔV(@500 hr) |
|---|---|---|---|---|---|
| Comparative Example 1 | 11.7 | 20 | 0.125 | 370 hr | 1 V |
| Example 1 | 10.5 | 24.5 | 0.125 | 550 hr | 0.2 V |

(ΔV indicates the change in voltage after 550 hours)

Table 1 illustrates that the light-emitting device of Example 1 is more excellent than that of the light-emitting device of Comparative Example 1.

Comparative Observation of Hole Injection Layer Surface

The hole injection layer of Comparative Example 1 and the hole injection layer of Example 1 were observed comparatively using a scanning electron microscope.

FIG. 3 is a scanning electron microscope photograph (×3000) illustrating the hole injection layer of Comparative Example 1 and the hole injection layer of Example 1.

Referring to FIG. 3, the hole injection layer of Comparative Example 1 has lower coverage than the hole injection layer of Example 1. Low coverage increases driving voltage and decreases efficiency and lifespan of a device. This corresponds with the results illustrated in Table 1.

Because the solution processing method, such as spin coating, forms a thin film using a centrifugal force, application to a large-area substrate is impossible, and the thickness uniformity of the center and the edge of the substrate is low.

In the case of spray coating, because a large amount of solvent is included to maintain low viscosity, the droplets are large and do not evaporate immediately after reaching the substrate to be adhered, thereby causing aggregation between droplets and making uniform coating impossible. The result is also illustrated in the photograph of Comparative Example 1 in FIG. 3.

The method of forming a perovskite thin film according to an embodiment may freely adjust the composition of the solution by using the dual nozzle, remove the solvent in the spraying process by voltage difference, and minimize aggregation of droplets sprayed on the substrate, thereby highly improving coverage and allowing the formation of a void free thin film.

In the method of forming a perovskite thin film according to an embodiment, large-area thin film formation and pattern formation may be possible, and coverage may be improved.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A method of forming a perovskite thin film, the method comprising:
preparing a substrate;
spraying a first solution of a first perovskite compound precursor through an inner nozzle of a dual nozzle including the inner nozzle and an outer nozzle;
spraying a second solution of a second perovskite compound precursor through the outer nozzle;
forming a perovskite compound solution by reacting the first solution of the first perovskite compound precursor and the second solution of the second perovskite compound precursor;
forming a membrane on the substrate from the perovskite compound solution; and
evaporating a solvent of the perovskite compound solution from the membrane on the substrate.

2. The method of forming a perovskite thin film of claim 1, wherein the perovskite compound is a non-lead-based perovskite compound.

3. The method of forming a perovskite thin film of claim 1, wherein the spraying of the first solution of the first perovskite compound precursor and the spraying of the second solution of the second perovskite compound precursor are performed simultaneously.

4. The method of forming a perovskite thin film of claim 1, wherein a voltage difference exists between the substrate and the dual nozzle by application of an electric field.

5. The method of forming a perovskite thin film of claim 4, wherein the voltage difference is 50 keV or less.

6. The method of forming a perovskite thin film of claim 1, wherein the first perovskite compound precursor is a first metal halogen compound, the second perovskite compound precursor is a second metal halogen compound, and
the first metal halogen compound and the second metal halogen compound are different metal halogen compounds.

7. The method of forming a perovskite thin film of claim 1, wherein the first perovskite compound precursor is represented by Formula 1:

$$A_\alpha A'_{\alpha'} X \qquad \text{Formula 1}$$

wherein, in Formula 1, A and A' each independently represent an alkali metal, an alkaline earth metal, or a lanthanide metal,
X represents a halogen, and
α and α' each independently represent a number from 0 to 1.

8. The method of forming a perovskite thin film of claim 1, wherein the second perovskite compound precursor is represented by Formula 2:

$$B_\beta B'_{\beta'} X \qquad \text{Formula 2}$$

wherein, in Formula 1, B and B' each independently represent a transition metal or a post transition metal,
X represents a halogen, and
β and β' each independently represent a number from 0 to 1.

9. The method of forming a perovskite thin film of claim 1, wherein the perovskite compound is represented by Formula 3:

$$A_\alpha A'_{\alpha'} B_\beta B'_{\beta'} X_\gamma \qquad \text{Formula 3}$$

in Formula 3, A, A', α, and α' are as defined in Formula 1, B, B', β, and β' are as defined in Formula 2,
X represents a halogen, and
γ represents a number from 1 to 9.

10. The method of forming a perovskite thin film of claim 1, wherein the first solution includes the first solvent, the second solution includes the second solvent, and the first solvent and the second solvent are organic solvents.

11. The method of forming a perovskite thin film of claim 10, wherein the organic solvent has a boiling point of about 110° C. to about 200° C.

12. The method of forming a perovskite thin film of claim 10, wherein the first solvent and the second solvent are identical organic solvents.

13. The method of forming a perovskite thin film of claim 10, wherein the organic solvent is dimethylformamide (DMF), dimethyl sulfoxide (DMSO), o-dichlorobenzene, m-dichlorobenzene, p-dichlorobenzene, or any combination thereof.

14. The method of forming a perovskite thin film of claim 1, wherein a temperature of the first solution is about 15° C. to about 200° C.

15. The method of forming a perovskite thin film of claim 1, wherein a temperature of the second solution is about 15° C. to about 200° C.

16. The method of forming a perovskite thin film of claim 1, wherein a concentration of the first solution is about 0.01 M to about 1.0 M.

17. The method of forming a perovskite thin film of claim 1, wherein a concentration of the second solution is about 0.01 M to about 1.0 M.

18. The method of forming a perovskite thin film of claim 1, wherein a temperature of the substrate is 200° C. or less.

* * * * *